US011923838B2

(12) United States Patent
Genc et al.

(10) Patent No.: US 11,923,838 B2
(45) Date of Patent: Mar. 5, 2024

(54) INDUCTIVE DRAIN AND/OR BODY LADDERS IN RF SWITCH STACKS

(71) Applicant: pSemi Corporation, San Diego, CA (US)

(72) Inventors: Alper Genc, San Diego, CA (US); Peter Bacon, New Hampshire, CT (US)

(73) Assignee: PSEMI CORPORATION, San Diego, CA (US)

(*) Notice: Subject to any disclaimer, the term of this patent is extended or adjusted under 35 U.S.C. 154(b) by 0 days.

(21) Appl. No.: 17/807,663

(22) Filed: Jun. 17, 2022

(65) Prior Publication Data

US 2023/0412171 A1 Dec. 21, 2023

(51) Int. Cl.
*H03K 17/687* (2006.01)
*H03K 17/06* (2006.01)
*H03K 17/10* (2006.01)

(52) U.S. Cl.
CPC ........... *H03K 17/687* (2013.01); *H03K 17/06* (2013.01); *H03K 17/102* (2013.01); *H03K 2017/066* (2013.01)

(58) Field of Classification Search
CPC .... H03K 17/687; H03K 17/06; H03K 17/102; H03K 2017/066
See application file for complete search history.

(56) References Cited

U.S. PATENT DOCUMENTS

| | | | |
|---|---|---|---|
| 10,044,349 B2 | 8/2018 | Scott et al. |
| 10,236,872 B1 | 3/2019 | Willard et al. |
| 10,680,599 B1 | 6/2020 | Syroiezhin et al. |
| 10,715,133 B1 | 7/2020 | Scott et al. |
| 11,463,087 B2 | 10/2022 | Genc |
| 11,569,812 B2 | 1/2023 | Shapiro et al. |
| 11,601,126 B2 | 3/2023 | Willard |
| 11,671,090 B2 | 6/2023 | Genc |
| 2008/0129642 A1 | 6/2008 | Ahn et al. |
| 2011/0260774 A1 | 10/2011 | Granger-Jones et al. |
| 2014/0118053 A1 | 5/2014 | Matsuno |
| 2014/0312958 A1 | 10/2014 | Ranta et al. |
| 2015/0171860 A1 | 6/2015 | Blin |
| 2015/0341026 A1 | 11/2015 | De Jongh |

(Continued)

FOREIGN PATENT DOCUMENTS

| | | |
|---|---|---|
| CN | 113810034 A | 12/2021 |
| CN | 114629479 A | 6/2022 |

(Continued)

OTHER PUBLICATIONS

Corrected Notice of Allowability for U.S. Appl. No. 16/945,283, filed Jul. 31, 2020 on behalf of Psemi Corporation dated July 25, 2022. 4 pages.

(Continued)

*Primary Examiner* — Jung Kim
(74) *Attorney, Agent, or Firm* — Steinfl + Bruno LLP

(57) ABSTRACT

Methods and devices to reduce the gate-induced drain/body leakage current (GIDL) generated in FET switch stacks when in OFF state are disclosed. Such devices include inductors as part of bias networks coupled with drain/source terminals and/or body terminals of the transistors within the switch stack. Hybrid approaches where resistors in combination with inductors are implemented as part the bias network are also described.

21 Claims, 21 Drawing Sheets

(56) References Cited

U.S. PATENT DOCUMENTS

| | | | |
|---|---|---|---|
| 2016/0085256 A1 | 3/2016 | Cam et al. | |
| 2019/0245533 A1 | 8/2019 | Schleicher et al. | |
| 2019/0305768 A1 | 10/2019 | Willard et al. | |
| 2019/0305769 A1 | 10/2019 | Willard et al. | |
| 2020/0052594 A1 | 2/2020 | Phillips | |
| 2020/0119731 A1 | 4/2020 | Teggatz et al. | |
| 2020/0220534 A1* | 7/2020 | Koyama | H03K 17/102 |
| 2020/0382114 A1 | 12/2020 | Scott et al. | |
| 2021/0344338 A1 | 11/2021 | Willard et al. | |
| 2021/0391858 A1 | 12/2021 | Shapiro et al. | |
| 2022/0038092 A1 | 2/2022 | Genc | |
| 2022/0038097 A1 | 2/2022 | Genc et al. | |
| 2022/0038099 A1 | 2/2022 | Genc | |
| 2022/0190826 A1 | 6/2022 | Willard | |
| 2022/0381814 A1* | 12/2022 | Majima | H03K 17/18 |
| 2023/0208417 A1 | 6/2023 | Shapiro et al. | |
| 2023/0246643 A1 | 8/2023 | Willard | |

FOREIGN PATENT DOCUMENTS

| | | |
|---|---|---|
| CN | 116134731 A | 5/2023 |
| DE | 112021004123 T5 | 7/2023 |
| JP | 2010010728 A | 1/2010 |
| KR | 100916472 B1 | 9/2009 |
| KR | 102034620 B1 | 11/2019 |
| KR | 1020230043983 A | 3/2023 |
| WO | 2021/257602 A1 | 12/2021 |
| WO | 2022/035603 A1 | 2/2022 |
| WO | 2022/125274 A1 | 6/2022 |

OTHER PUBLICATIONS

Ex Parte Quayle for U.S. Appl. No. 17/119,840, filed Dec. 11, 2020, on behalf of Psemi Corporation. Mail Date: Aug. 13, 2021. 8 pages.
Final Office Action for U.S. Appl. No. 16/902,032, filed Jun. 15, 2020 on behalf of pSemi Corporation, dated Oct. 15, 2021. 17 Pages.
Final Office Action for U.S. Appl. No. 16/945,283, filed Jul. 31, 2020, on behalf of Psemi Corporation, dated Dec. 3, 2021. 31 Pages.
International Search Report and Written Opinion for International Application No. PCT/US2021/059387 filed on Nov. 15, 2021 on behalf of Psemi Corporation dated Mar. 8, 2022. 9 pages.
International Search Report and Written Opinion for International PCT Application No. PCT/US2021/037479 filed on Jun. 15, 2021 on behalf of pSemi Corporation, dated Oct. 7, 2021. 8 pages.
International Search Report and Written Opinion for International PCT Application No. PCT/US2021/043544 filed on Jul. 28, 2021 on behalf of pSemi Corporation, dated Feb. 8, 2022. 12 Pages.
International Search Report and Written Opinion for International PCT Application No. PCT/US2021/043544 filed on Jul. 28, 2021 on behalf of pSemi Corporation, dated Jan. 21, 2022. 10 Pages.
Non-Final Office Action for U.S. Appl. No. 16/902,032, filed Jun. 15, 2020 on behalf of Psemi Corporation, dated Jan. 8, 2021. 15 Pages.
Non-Final Office Action for U.S. Appl. No. 16/902,032, filed Jun. 15, 2020 on behalf of pSemi Corporation, dated Mar. 29, 2022. 14 Pages.
Non-Final Office Action for U.S. Appl. No. 16/945,283, filed Jul. 31, 2020 on behalf of Psemi Corporation, dated Mar. 2, 2021. 24 pages.
Non-Final Office Action for U.S. Appl. No. 17/119,840, filed Dec. 11, 2020 on behalf of Psemi Corporation dated Apr. 18, 2022. 10 pages.
Non-Final Office Action for U.S. Appl. No. 17/386,374, filed Jul. 27, 2021 on behalf of Psemi Corporation dated Jul. 15, 2022. 29 pages.
Non-Final Office Action issued for U.S. Appl. No. 17/386,409, filed Jul. 27, 2021, on behalf of pSemi Corporation, dated Jul. 13, 2022. 28 Pages.
Notice of Allowance for U.S. Appl. No. 16/902,032, filed Jun. 15, 2020, on behalf of pSemi Corporation, dated Sep. 28, 2022. 9 Pages.
Notice of Allowance for U.S. Appl. No. 16/945,283, filed Jul. 31, 2020 on behalf of Psemi Corporation dated May 10, 2022. 12 pages.
Notice of Allowance for U.S. Appl. No. 17/119,840, filed Dec. 11, 2020, on behalf of Psemi Corporation, dated Jan. 19, 2022. 6 Pages.
Notice of Allowance for U.S. Appl. No. 17/119,840, filed Dec. 11, 2020, on behalf of Psemi Corporation, dated Oct. 22, 2021. 5 Pages.
Notification of Passing Preliminary Examination for CN Application No. 202110662394.7 filed of Jun. 15, 2021, on behalf of Psemi Corporation, dated Jul. 29, 2021. CN Original+ English Translation. 2 Pages.
Notification of Passing Preliminary Examination issued for Chinese Application No. CN 202111500870.1 filed on Dec. 9, 2021 on behalf of Psemi Corporation, dated Jan. 29, 2022. 2 Pages. CN original + English Translation. 2 Pages.
Restriction Requirement for U.S. Appl. No. 17/119,840, filed Dec. 11, 2020 on behalf of Psemi Corporation dated May 17, 2021. 6 pages.
Final Office Action for U.S. Appl. No. 17/386,374, filed Jul. 27, 2021 on behalf of Psemi Corporation, dated Jan. 24, 2023 28 pages.
International Search Report and Written Opinion issued for International PCT Application No. PCT/US2023/023427 filed on May 24, 2023 on behalf of Psemi Corporation, dated Sep. 20, 2023. 9 pages.
Non-Final Office Action issued for U.S. Appl. No. 18/146,753, filed Dec. 27, 2022 on behalf of Psemi Corporation, dated Sep. 15, 2023. 12 Pages.
Non-Final Office Action Issued for U.S. Appl. No. 18/161,802, filed Jan. 30, 2023 on behalf of Psemi Corporation, dated Sep. 12, 2023. 12 pages.
Notice of Allowance for U.S. Appl. No. 17/119,840, filed Dec. 11, 2020 on behalf of Psemi Corporation, dated Nov. 2, 2022. 8 pages.
Notice of Allowance issued for U.S. Appl. No. 17/386,409, filed Jul. 27, 2021, on behalf of Psemi Corporation, dated Jan. 30, 2023. 10 Pages.

* cited by examiner

INDUCTIVE DRAIN AND/OR BODY LADDERS IN RF SWITCH STACKS

BACKGROUND

(1) Technical Field

The present disclosure is related to radio frequency (RF) switches, more in particular to methods and devices to overcome the undesired impacts of the body leakage current in field-effect transistor (FET) switches by providing inductive drain and/or body ladders in RF switch stacks.

(2) Background

As part of a receiver front-end design, RF switches are generally implemented in stacked configuration due to the large RF power handling requirement of such switch stacks. FIG. 1A shows a prior art field effect transistor (FET) switch stack (100) including a series arrangement of transistors (T1, . . . , Tn). The FET switch stack (100) implements a bias network including a body resistor ladder (120) comprising body resistors (RB1, . . . , RBn+1), a drain-source resistor ladder (110) including drain-source resistors (RD1, . . . , RDn) and a gate resistor structure on the gate side of the transistors as shown. Bias voltages (VB, VG) are applied at the gate and body sides to bias switch stack (100). FET switch stack (100) is connected at one end to node (N1) where an RF signal is applied and another end to node (N2) which can be ground, a reference voltage, or the rest of an RF circuit based on possible shunt or series implementation of the FET switch stack (100).

In operative conditions, when the stacked switches experience RF swings during the OFF state, each transistor within the stack will generate an undesired gate-induced drain/body leakage current (GIDL) which increases as the peak of the RF swing increases. The GIDL current flows through the drain-source resistor ladder (110) in the direction of arrow (101) and in the body resistor ladder (120) in the direction of arrow (102) as shown in FIG. 1A. As a result of the flow of the undesired GIDL current, the effective DC voltage distribution across the body resistive ladder is modified. In other words, various switch stack nodes within the body resistor and drain-source ladder will experience undesired DC bias voltages different from what the biasing circuit would have provided to such nodes in the absence of such leakage current. Throughout the disclosure, the undesired effect of GIDL current on the DC bias voltage distribution throughout the stack may be referred to as the "de-biasing" effect.

The de-biasing effect is further illustrated by curves (103, 104) of FIGS. 1B and 1C respectively. Curve (103) represents an exemplary DC average voltage profile for drain terminals of the transistors (T1, . . . , Tn) of switch stack (100) of FIG. 1A, plotted with reference to the position of the transistors in the stack, from top (Tn) to bottom (T1), while curve (104) is a representation of the DC average profile for the body terminals of such transistors vs. the position of the transistors in the stack, from top (Tn) to bottom (T1). In this example, switch stack (100) of FIG. 1A includes nine transistors, i.e. there are nine points on each of curves (103, 104). With reference to FIG. 1B, the DC voltage at the drain terminal of the transistor in the middle of the stack reaches its minimum, i.e., the debiasing effects is more severe in the middle of the stack. On the other hand, the DC voltages at the body terminals of the FETs decrease from the top to the bottom of the stack, as shown in FIG. 1C.

In other words, the voltage at the body terminal of transistor (Tn) has the highest magnitude and that of transistor (T1) has the lowest magnitude, due to the unbalanced voltage distribution resulting from the undesired GIDL current.

The body de-biasing as described above can result in early breakdown of the transistors within the FET switch stacks, especially for transistors disposed closer to the top of the stacks.

SUMMARY

The disclosed methods and devices address the above-mentioned problems.

According to a first aspect of the present disclosure, a switch stack is provided, comprising: a plurality of field-effect transistors (FETs) arranged in series and connected at one end to a first node and at another end to a second node; a drain bias ladder comprising one or more drain inductors coupled across drain and source terminals of corresponding one or more first FETs of the plurality of FETs According to a second aspect of the present disclosure, a switch stack is provided, comprising: a plurality of field-effect transistors (FETs) arranged in series and connected at one end to a first node and at another end to a second node; and a body bias ladder comprising one or more body inductors, wherein each of the one or more body inductors is coupled across body terminals of a corresponding pair of first adjacent FETs.

According to a third aspect of the present disclosure, A method of equalizing drain or body voltages in a switch stack comprising a plurality of field-effect transistors (FETs) connected in series and being in an OFF state, each FET comprising a drain terminal and a source terminal, is disclosed, the method comprising: inductively coupling together the drain terminal and the source terminal of at least one FET, to reduce drain de-biasing.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Figure 1A:
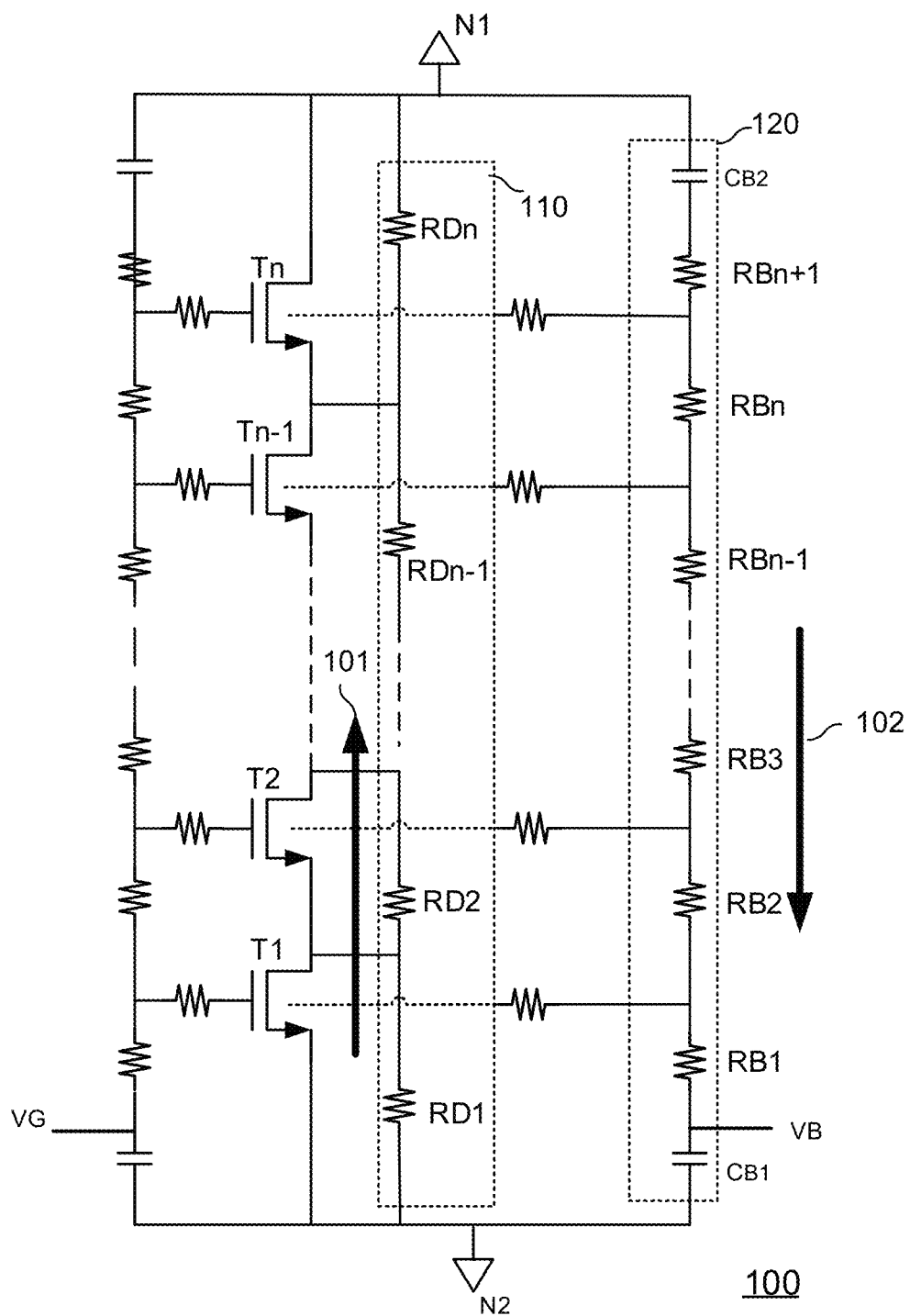
FIG. 1A shows a prior art FET switch stack.
Figure 1B:
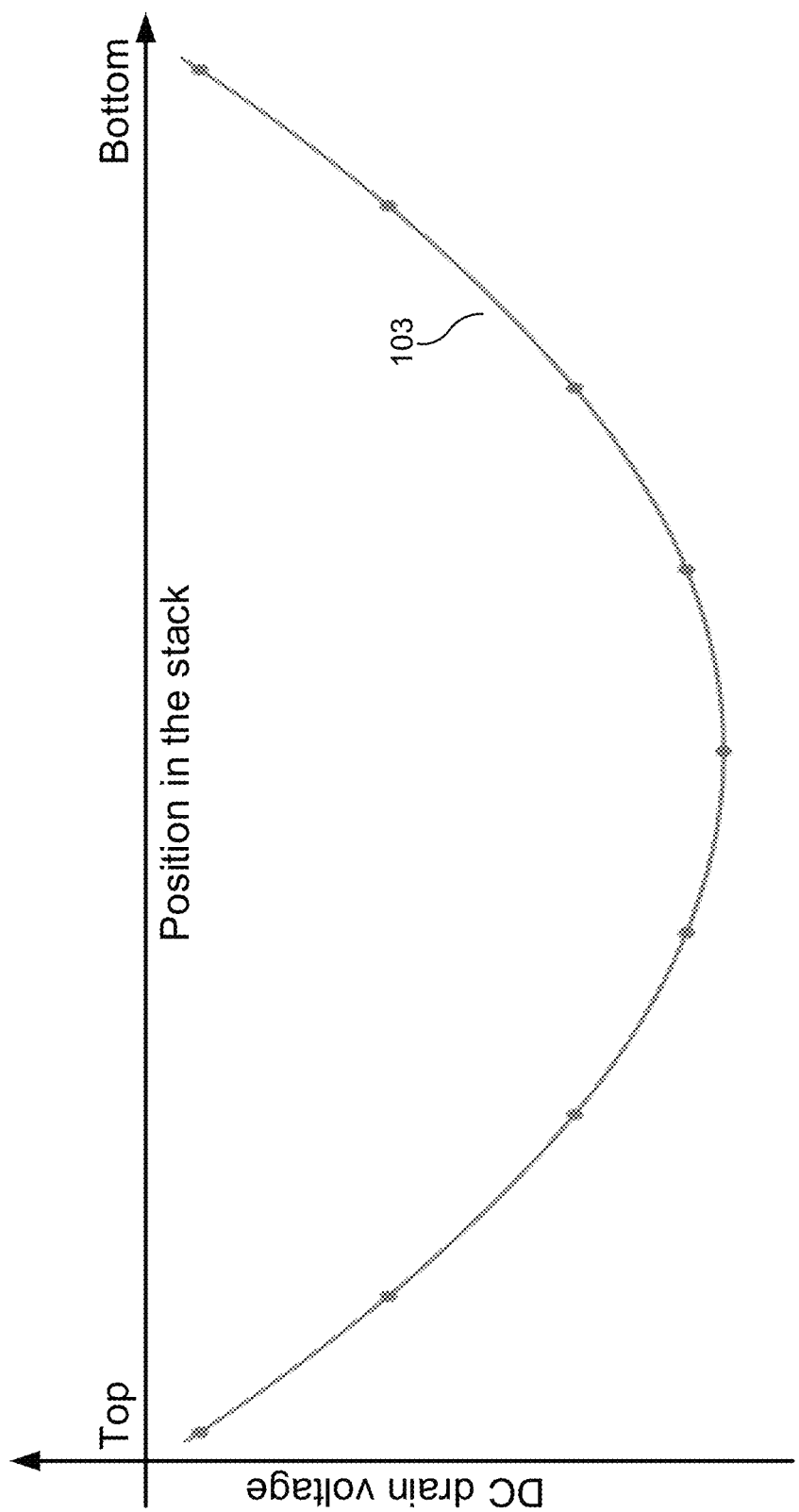
FIG. 1B shows a prior art graph representing the drain DC voltage profile of the drain terminals of the FETs within a switch stack vs. position of the FETs in the stack.

With reference to FIG. 1A, in operative conditions when FET switch stack (100) is in OFF state, as a result of applying an RF voltage to node (N1), GIDL current including an RF (AC) component and a DC component will be generated. The reason for the presence of a DC component in such current is that during the positive RF cycles, the GIDL current flows from the drain terminal to the source terminal of each transistor in the stack, while during the negative RF cycles such current flows from the source terminal to the body terminal of each transistor. In other words, the generated GIDL current always flow out of the body terminal of such transistors regardless of the RF cycle. This means that the GIDL current will include a DC component which is the reason for the above-described de-biasing issues. According to the teachings of the disclosure, a biasing circuit acting as close to a short circuit as possible for the DC and as close as possible to an open circuit for the AC component will help overcome the de-biasing issues by reducing the undesired effect of the DC component of the GIDL current. In other words, biasing networks including inductive elements can be a solution for the de-biasing issues as described above. In what follows, various embodiments implementing such teachings will be described in detail.

Figure 2A:
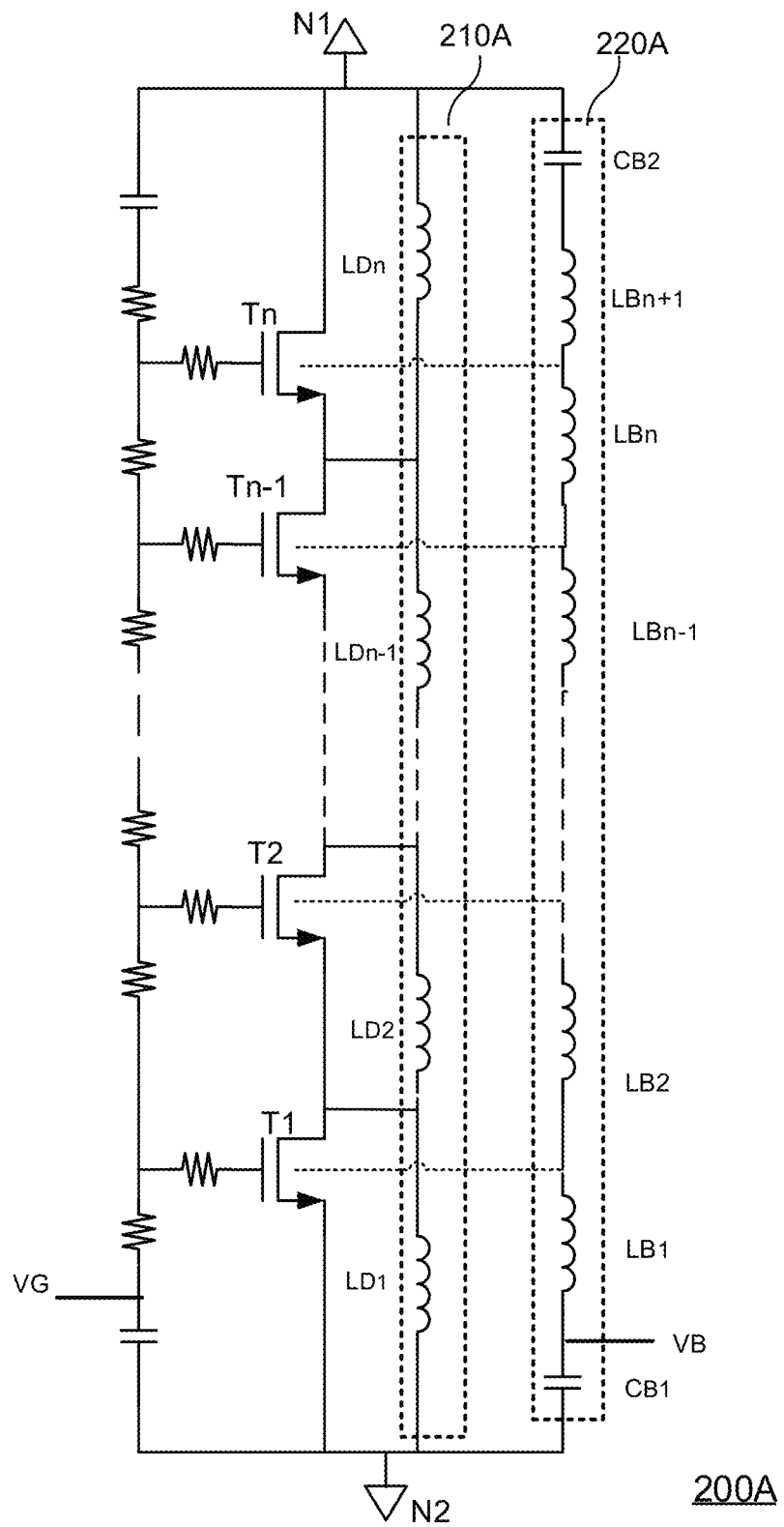
FIG. 2A shows an exemplary FET switch stack according to an embodiment of the present disclosure.

FIG. 2A shows an exemplary FET switch stack (200A) according to an embodiment of the present disclosure. FET switch stack (200A) comprises a series arrangement of transistors (T1, . . . , Tn) and implements a bias network including a body bias ladder (220A) comprising body inductors (LB1, . . . , LBn+1) and series capacitors (CB1, CB2), a drain-source bias ladder (210A) including drain-source inductors (LD1, . . . , LDn) and a gate resistor structure on the gate side of the transistors as shown. Bias voltages (VB, VG) are applied at the gate and body sides to bias switch stack (200A). FET switch stack (200A) is connected at one end to node (N1) where the RF signal is applied and another end to node (N2) which can be ground, a reference voltage or the rest of the RF circuit depending upon possible series or shunt implementation of FET switch stack (200A).

Figure 1C:
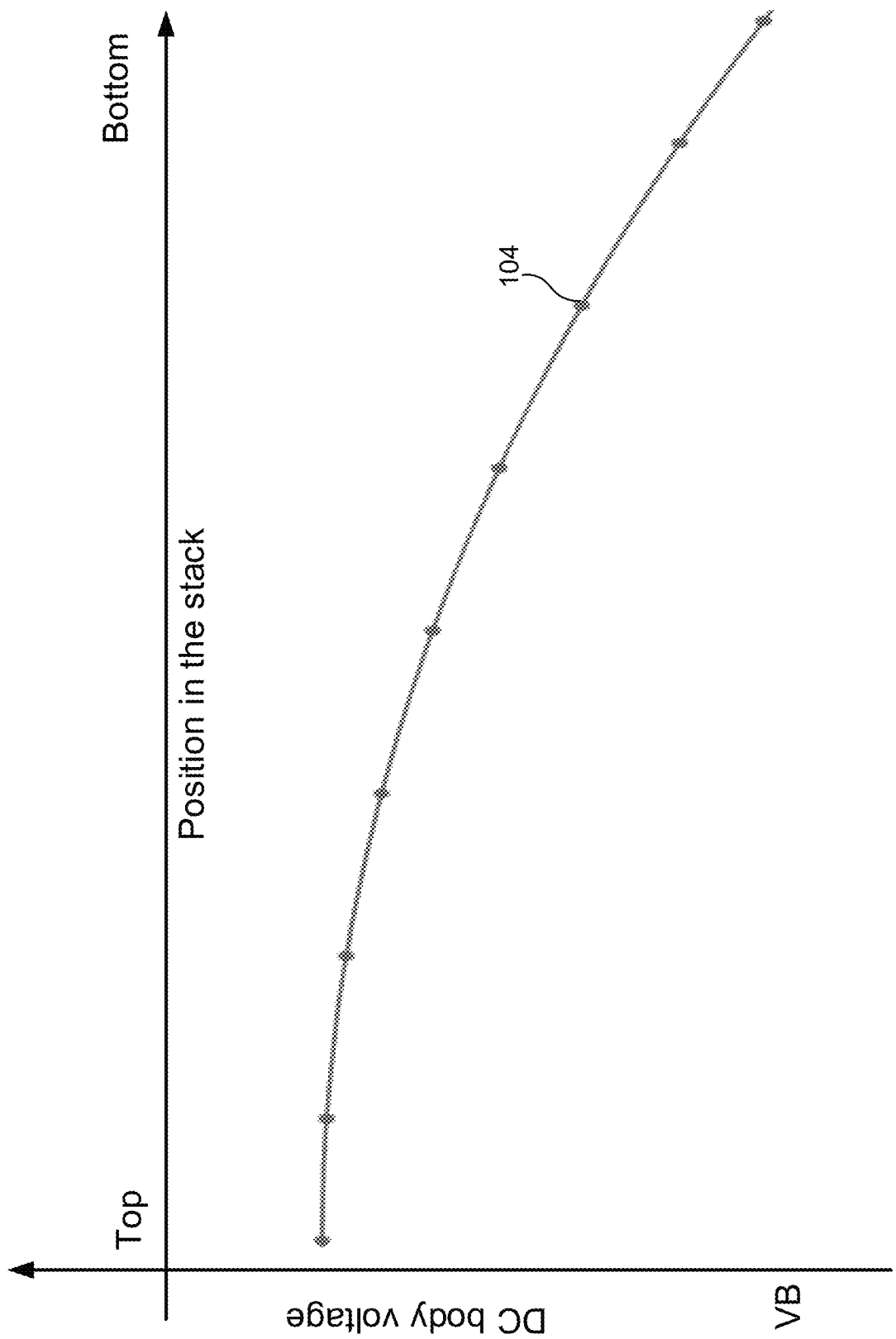
FIG. 1C shows a prior art graph representing the body DC voltage profile of the body terminals of the FETs within a switch stack vs. position of the FETs in the stack.
Figure 2B:
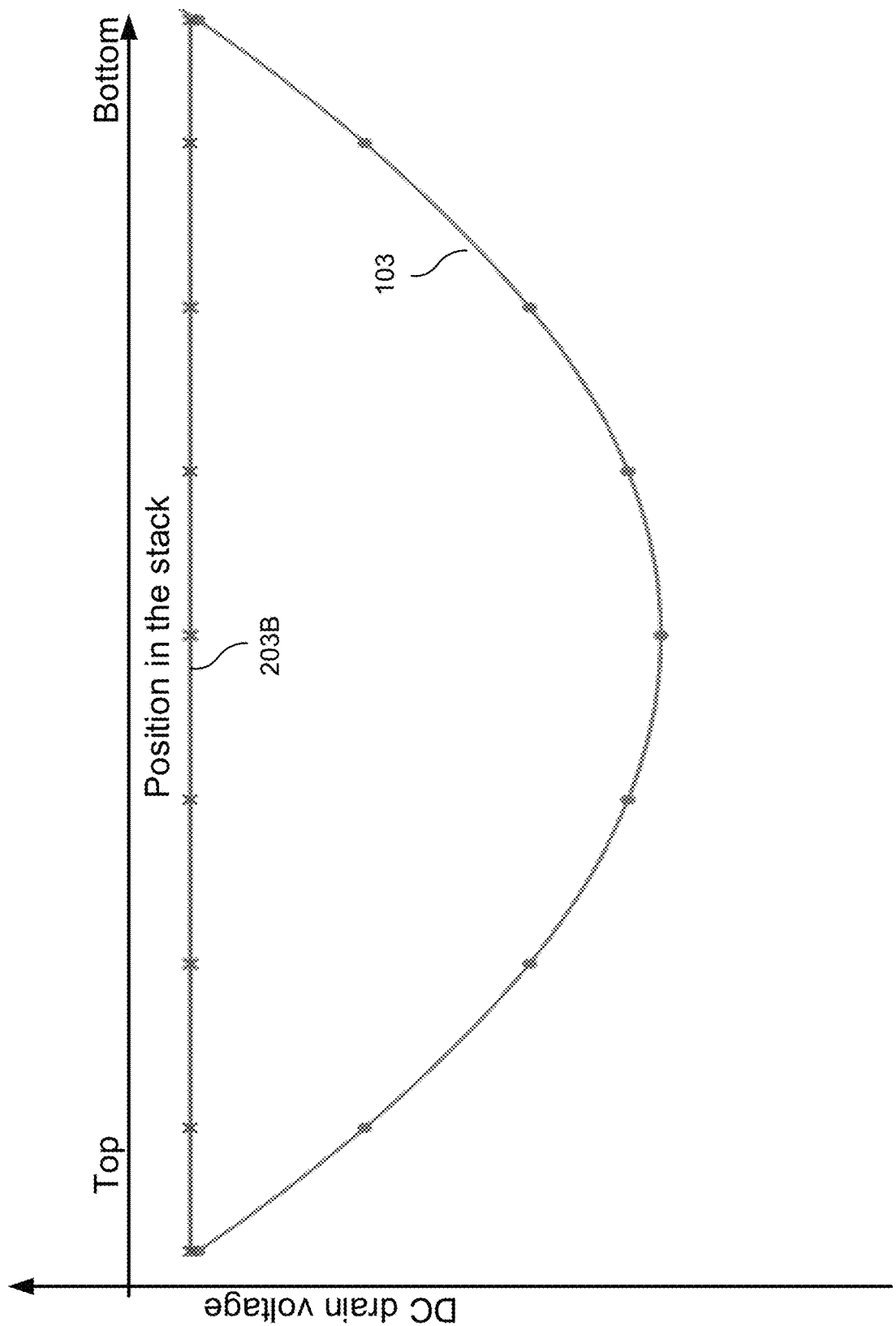
FIG. 2B shows an exemplary graph representing the drain DC voltage profile of the drain terminals of the FETs within a switch stack vs. position of the FETs in the stack according to an embodiment of the present disclosure.
Figure 2C:
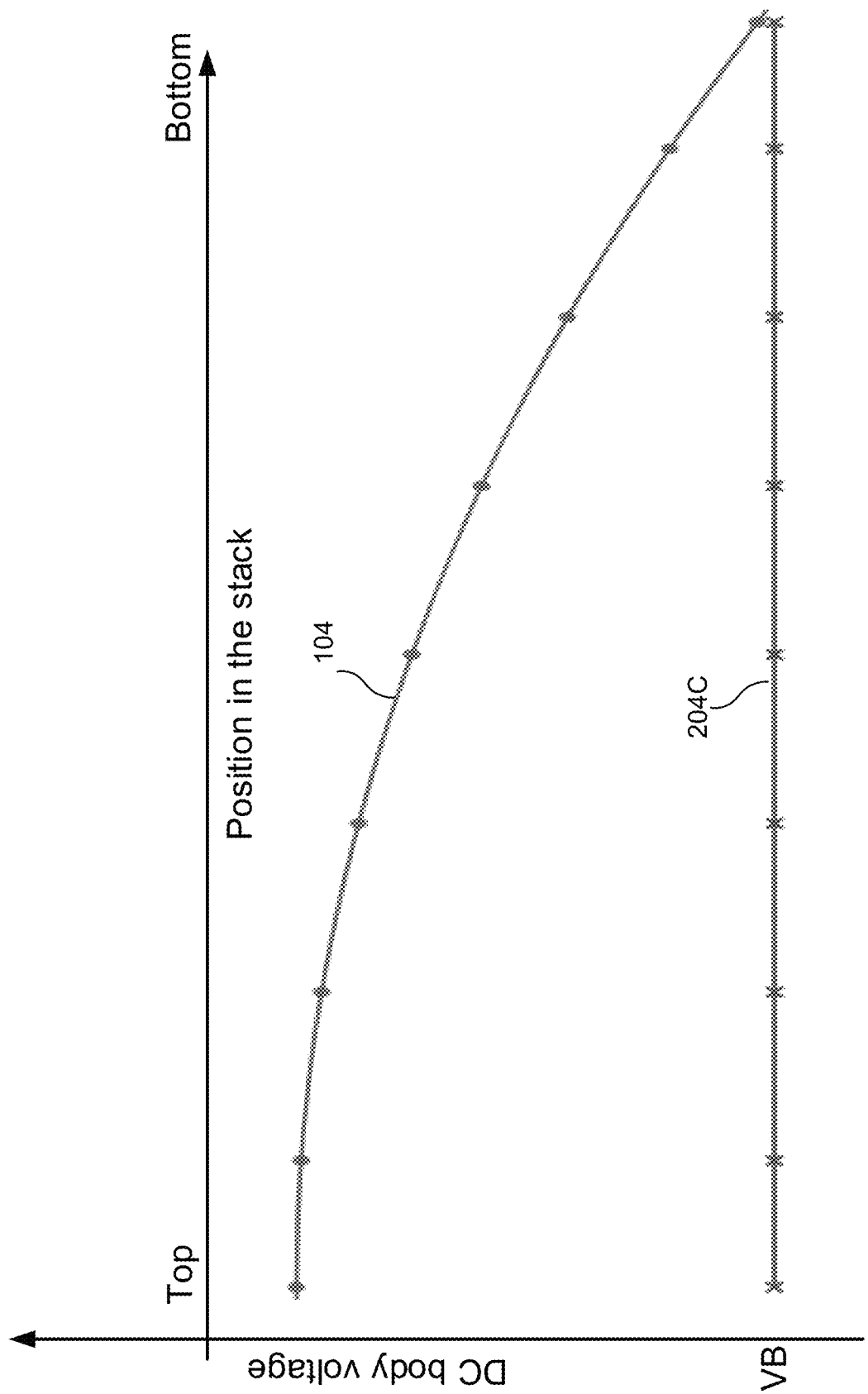
FIG. 2C shows an exemplary graph representing the body DC voltage profile of the body terminals of the FETs within a switch stack vs. position of the FETs in the stack according to an embodiment of the present disclosure.

Bias ladders (210A, 220A) include inductors which will function as short and open circuits for the above described DC and AC components, thus reducing the negative impact of the GIDL current as described previously. In order to further demonstrate this, reference is made to FIGS. 2B-2C representing the impact of implementing inductive bias ladders as shown in FIG. 2A compared to resistive bias ladders as shown in FIG. 1A. Curve (103) of FIG. 2B is the reproduction of curve (103) of FIGS. 1A and 1s shown for comparison purpose. Curve (203B) of FIG. 2B shows the DC average voltage profile for drain terminals of the transistors of switch stack (200A) of FIG. 2A, plotted also with reference to the position of the transistors in the stack. As can be noticed, the de-biasing of drain terminals has been substantially reduced by implementing inductors in the drain bias ladder (210A) instead of resistors as implemented in drain resistor ladder (110) of FIG. 1A. Similarly, referring now to FIG. 2C, curve (204C) shows the DC average voltage profile for body terminals of the transistors of switch stack (200A) of FIG. 2A vs. the position of the transistors within the stack. Again, the de-biasing issues on the body terminals has been substantially reduced compared to curve (104), i.e. a reproduction of curve (104) of FIG. 1C, which shows the body DC voltage profile in the case of switch stack (100) of FIG. 1A. According to an embodiment of the present disclosure, the inductor value of one or more of the inductors within drain-source bias ladder (210A) is selected to resonate, within a band of operation, with the off capacitance of corresponding one or more transistors of the switch stack.

Referring back to FIG. 2A, some embodiments may not implement one or both series capacitors (CB1, CB2). Moreover, the number of inductors implemented within any of the bias ladders (210A, 220A) can be any number greater or equal to 1. To demonstrate this, reference is made to FIG. 2D where another embodiment with a lower number of inductors (compared to the embodiment of FIG. 2A) is implemented. Moreover, capacitors (CB1, CB2) of FIG. 2A are not used when implementing the embodiment of FIG. 2D. In some embodiments, capacitors (CB1, CB2) are used to provide a means to connect the RF voltage swing of the input signal to the bias ladder. Without these capacitors, extreme voltages and non-uniform voltages and currents may arise due to the RF voltage differences between the switch stack drain/source voltage levels and the DC level of the bias ladder.

Figure 2D:
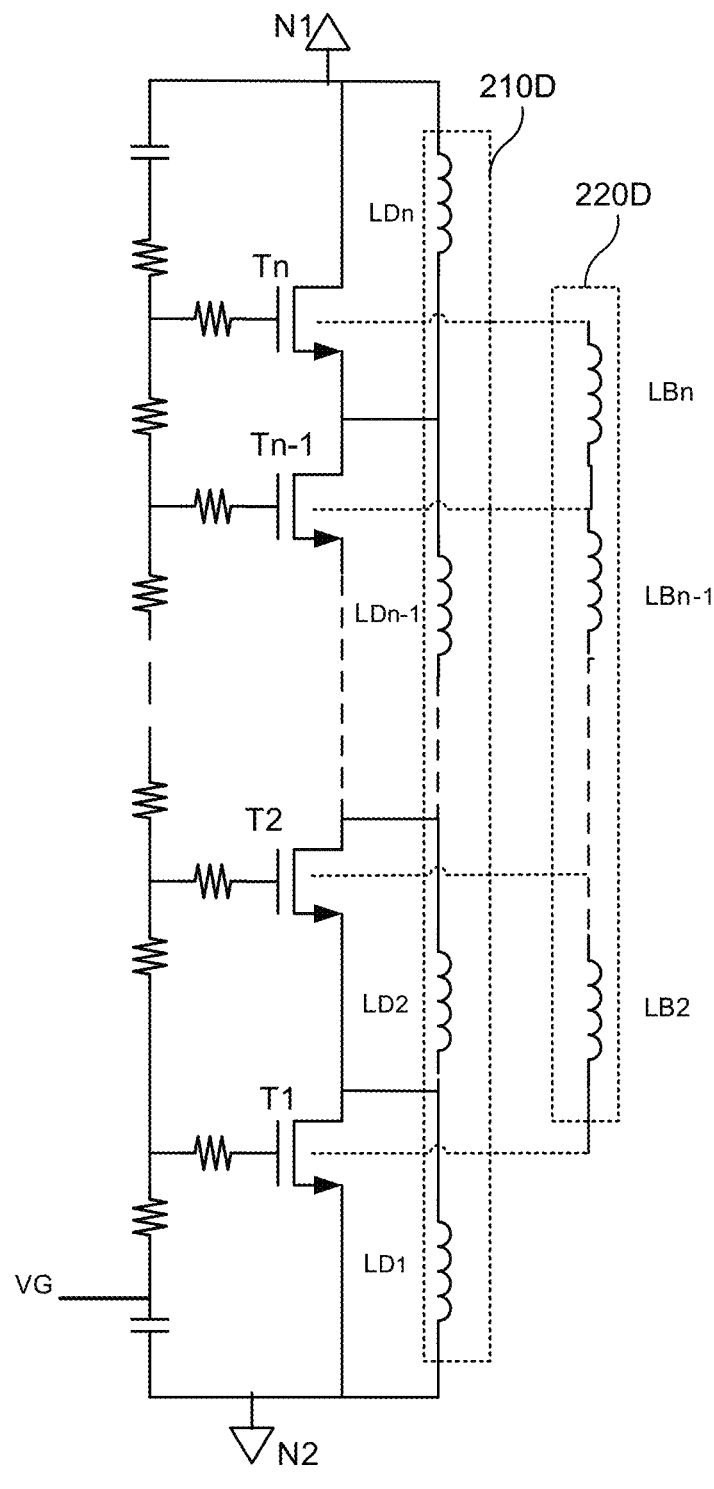
FIGS. 2D-2I show exemplary FET switch stacks according to embodiments of the present disclosure.

With reference to FIGS. 2A and 2D, according to the teachings of the present disclosure, instead of providing a one-to-one correspondence between inductors and FET transistors, some of the inductors within drain-source bias ladders (210A, 210D) may be replaced by resistors or removed (e.g. no inductor across one or more of FET transistors). Moreover, some of the inductors within body bias ladders (220A, 220D) may be replaced by resistors or shorted. In other words, bias ladders (210A, 210D, 220A, 220D) may be designed using a hybrid approach where one or more serially connected resistors and one or more serially connected inductors are implemented and arranged in sequence. The number of inductors used in such arrangements is also any number greater or equal to 1. No resistors, or any number of resistors (in addition to at least one inductor) may be used when designing the bias ladders.

Figure 2E:
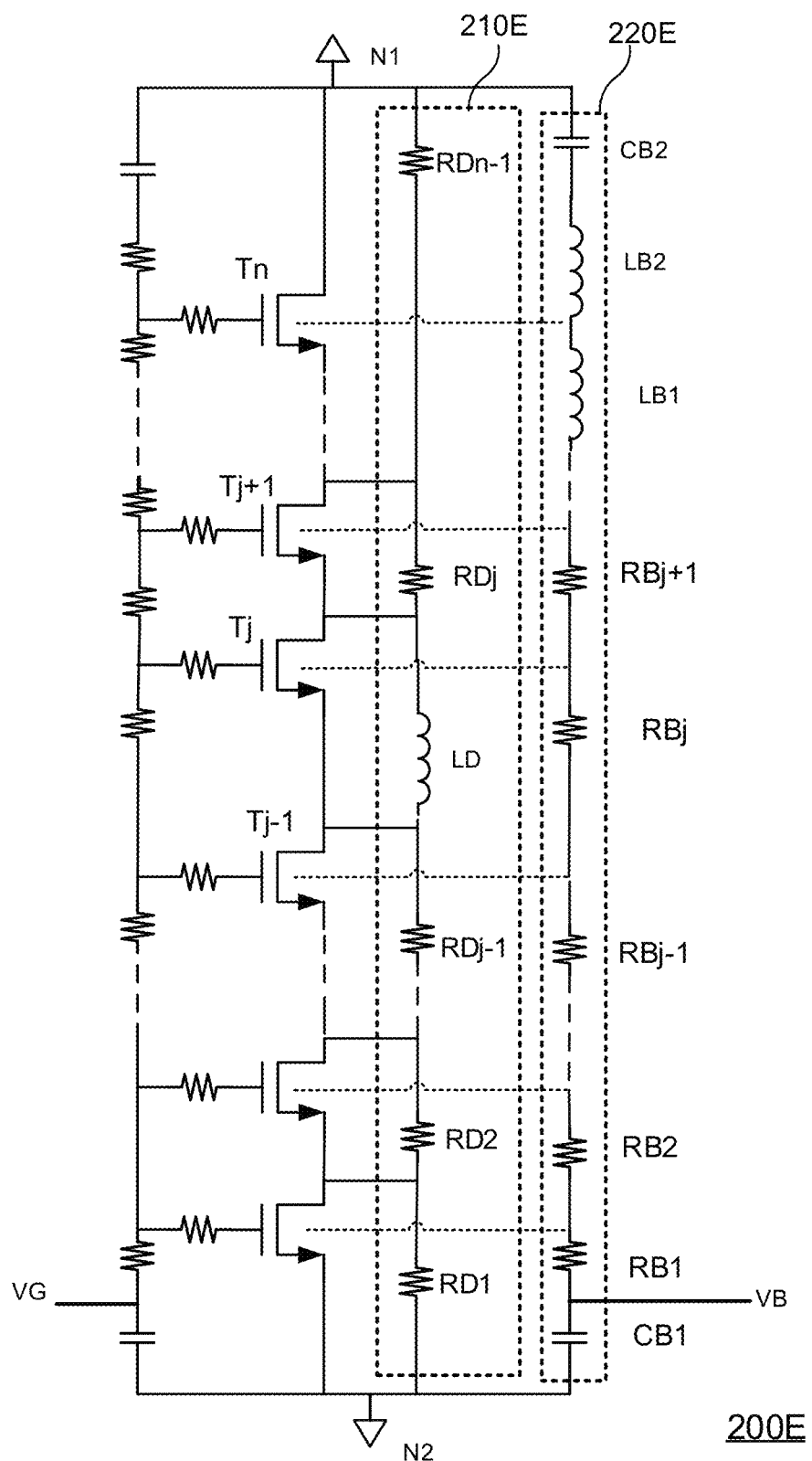

As known in the art of RF design, implementing on-chip inductors for higher frequencies is a challenging task due to inherently larger sizes of such inductors. As such, the above-mentioned embodiments using a combination of resistors and inductors within bias ladders will help reduce the occupied real estate on the chip. However, the amount of de-biasing may be compromised in such embodiments due to the use of a lower number of inductors. At the same time, by using resistors in addition to inductors as part of the bias network, the design can ensure that the overall off resistance (Roff) requirement of the switch stack is met. In other words, the number of resistors and inductors used within the bias ladders is a matter of tradeoff between the occupied space on the chip, the amount of de-biasing reduction, and the Roff resistance of the switch stack. FIG. 2E shows an exemplary switch stack (200E) demonstrating the above-mentioned teachings, where a hybrid approach is adopted when implementing bias ladders. In other words, drain-source bias ladder (210E) includes inductor (LD) in combination with resistors (RD1, . . . , RDn−1). Moreover, body bias ladder (220E) comprises a series arrangement of inductors (LB1, LB2) and resistors (RB1, . . . , RBj+1). As described previously, the most severe drain de-biasing occurs in the middle of the stack while the top of the stack is where the body de-biasing is the most pronounced. With continued reference to the exemplary embodiment of FIG. 2E, it can be noticed that inductor (LD) is disposed in the middle of the switch stack and coupled across middle transistor (Tj) to counter-act the maximum drain de-biasing. Similarly, the two inductors (LB1, LB2) are implemented towards the top of the stack to reduce the effect of the body de-biasing where it is most severe. With continued reference to FIG. 2E, in a preferred embodiment, a resistor may be implemented (not shown in FIG. 2E) in parallel with inductor (LD), across transistor (Tj). The presence of such resistor will help maintain a frequency independent impedance across transistor (Tj). This feature will be described more in detail later by describing another embodiment of the present disclosure.

In other embodiments, any number of inductors (and resistors, in addition to at least one inductor) may be implemented within bias ladders (210E, 220E) depending on the requirements and the application. Moreover, the position of such inductors (and resistors) may also be different from one embodiment to another, again depending on application and design requirements.

Figure 2F:
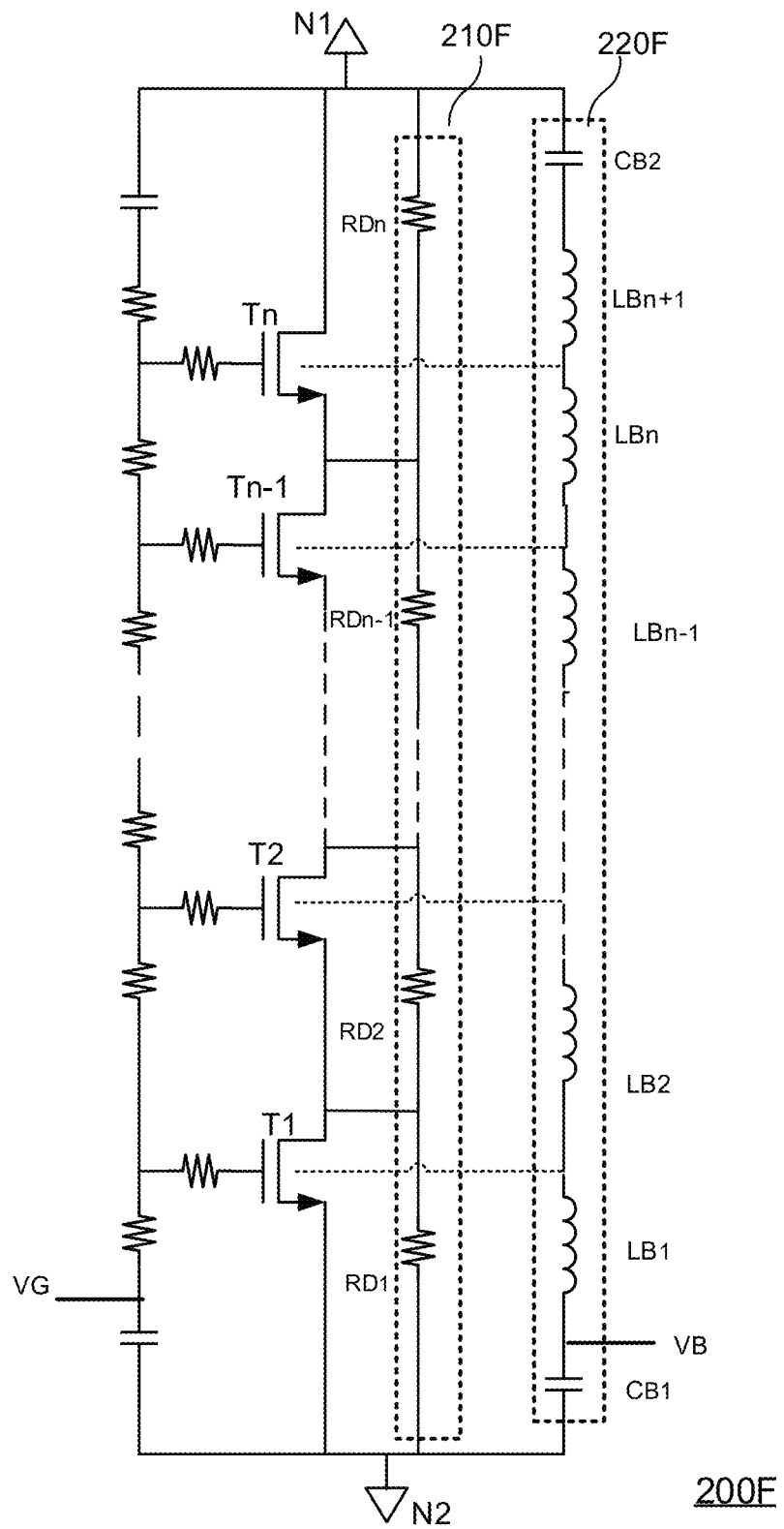
Figure 2G:
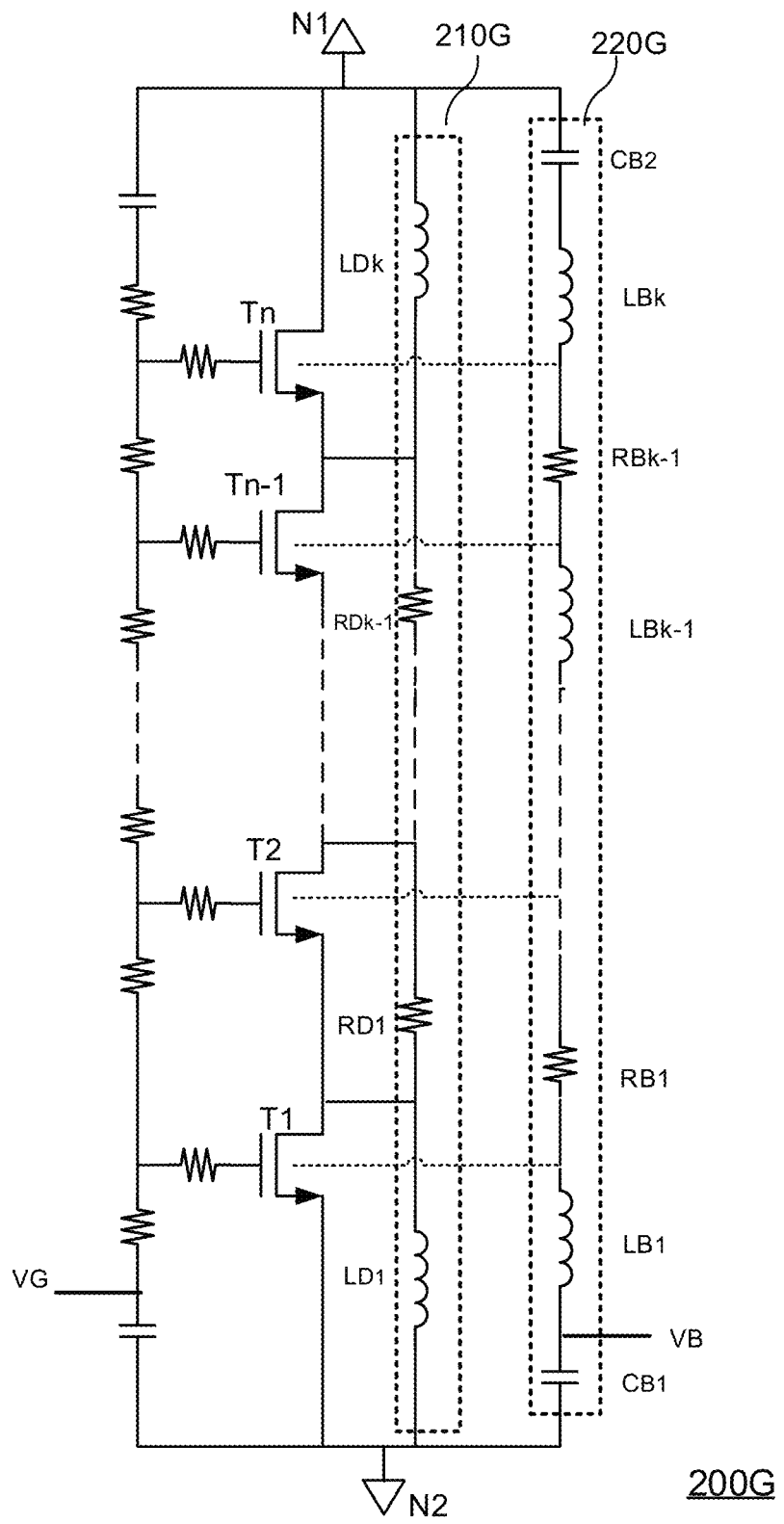

In order to further clarify the above-disclosed teachings and to reiterate the design flexibility offered by the teachings according to the present disclosure, reference is now made to FIG. 2F showing FET switch stack (200F) comprising drain bias ladder (210F) which is implemented using a series arrangement made of resistors only, while only inductors are used when implementing body bias ladder (220F). FIG. 2G shows another exemplary FET switch stack (200G) in accordance with an embodiment of the present disclosure, where each bias ladder (210G, 220G) is implemented using a sequence of alternating resistors and inductors arranged serially.

Figure 2H:
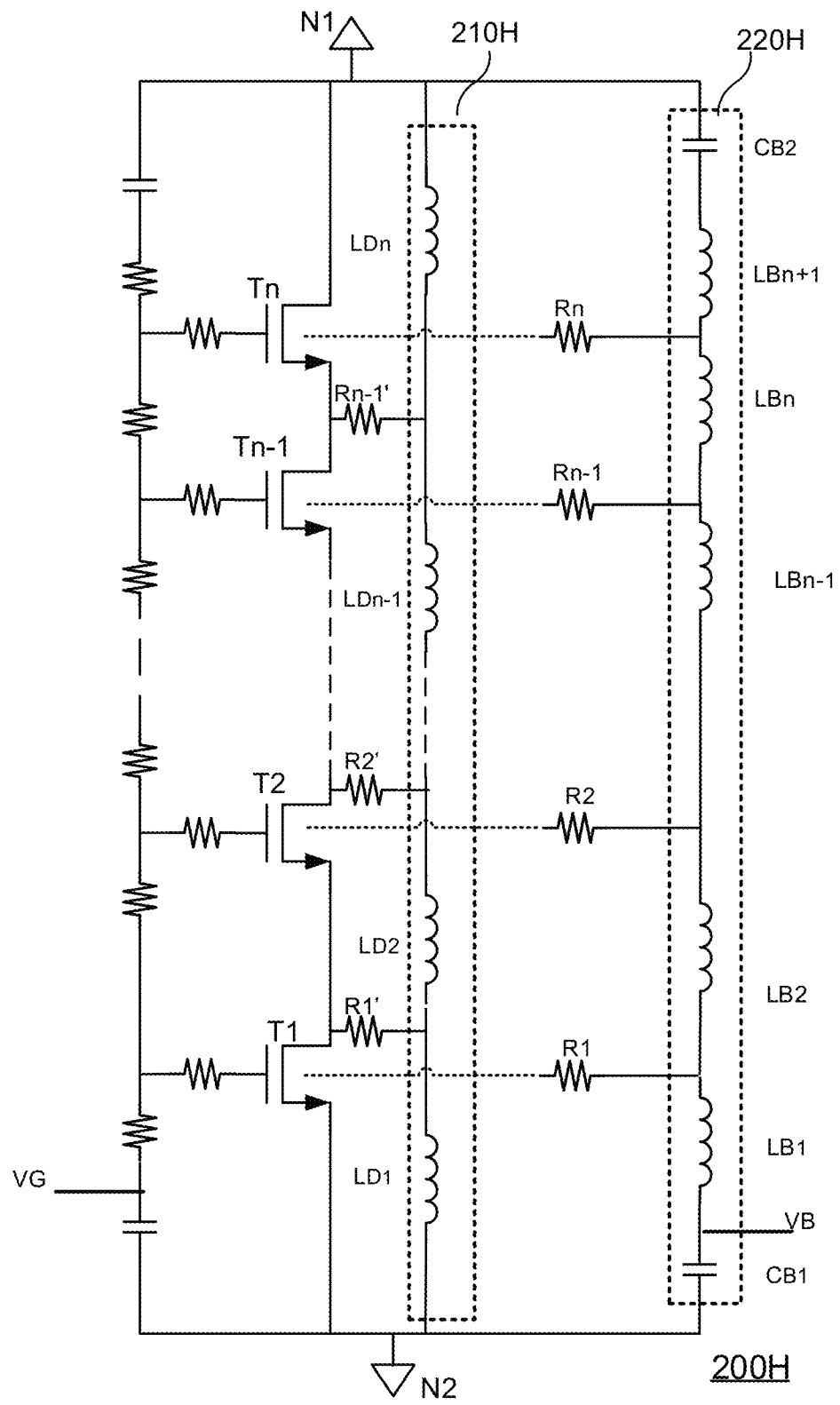
Figure 2L:
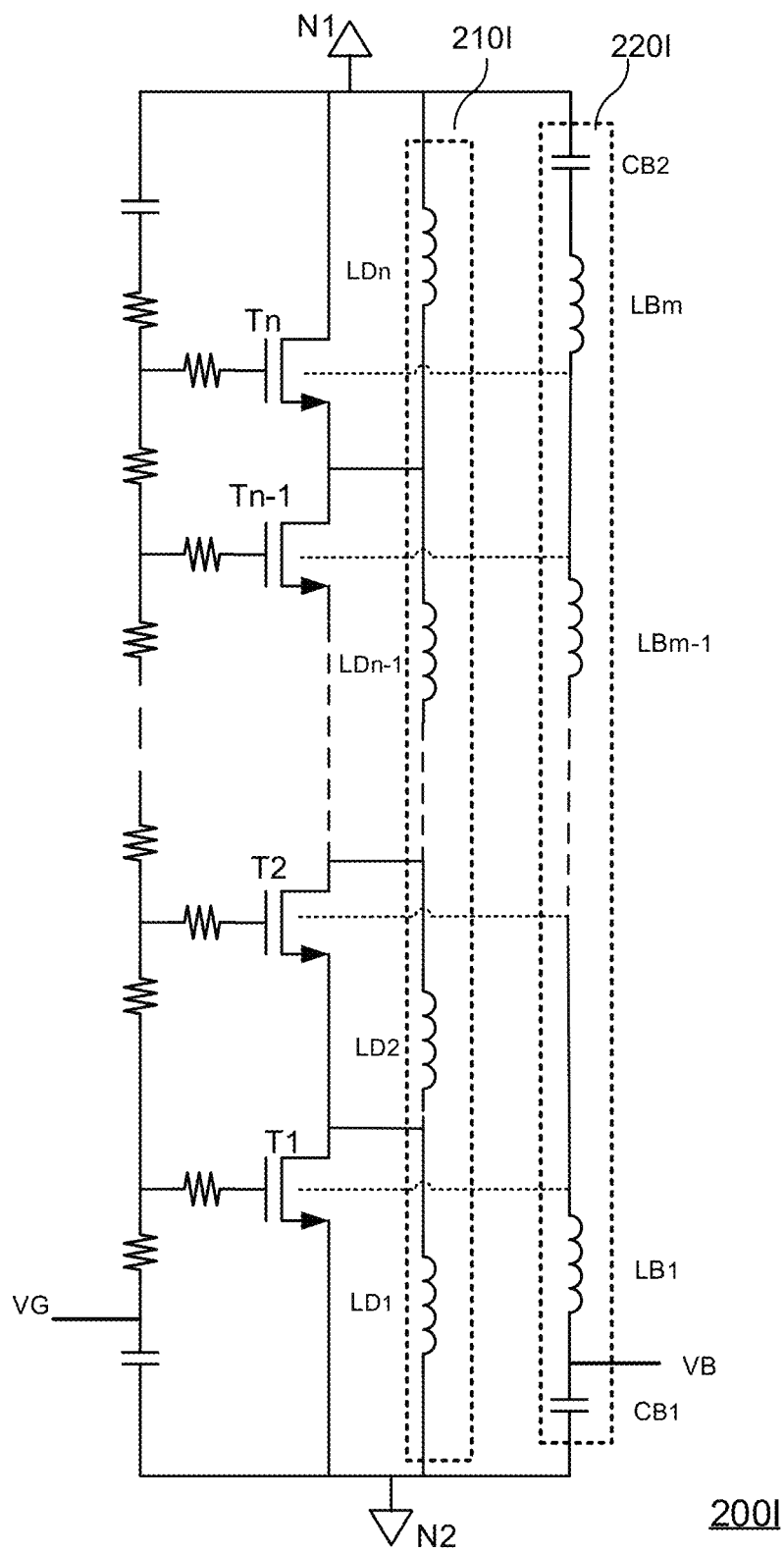
FIGS. 2J-2K show exemplary graphs showing DC voltage profiles in FET switch stacks according to embodiments of the present disclosure.

FIG. 2H shows a further exemplary FET switch stack (200H) according to embodiments of the present disclosure. The structure and functionality of FET switch stack (200H) is similar to what was described with regards to FET switch stack (200A) of FIG. 2A except that instead of a direct connection, the body terminals of transistors (T1, . . . , Tn) are coupled to corresponding inductors (LB1, . . . , LBn) within the body bias ladder (220H) through respective "rung" resistors (R1, . . . , Rn). Moreover, the drain terminals of transistors (T1, . . . , Tn−1) are coupled to corresponding inductors (LD1, . . . , LDn−1) within the body bias ladder (210H) through respective "rung" resistors (R1', . . . , Rn−1'). Such coupling can be used in all the embodiments shown in FIGS. 2D-2I and offers even more design flexibility in terms of the desired setting of the transistors' DC bias points and also meeting overall RF performance requirements of the switch stack. The number and the location of rung resistors within each of the ladders (210H, 220H) is arbitrary and can be chosen based on the application and related requirements.

The FET switch stack (200I) of FIG. 2I demonstrates yet another way of designing bias ladders within the disclosed FET switch stacks. As can be seen in such embodiment, the body terminals of one or more adjacent FET pairs are tied together. Such approach reduces the effective number of implemented inductors for the sake of saving occupied space on the chip.

Figure 2J:
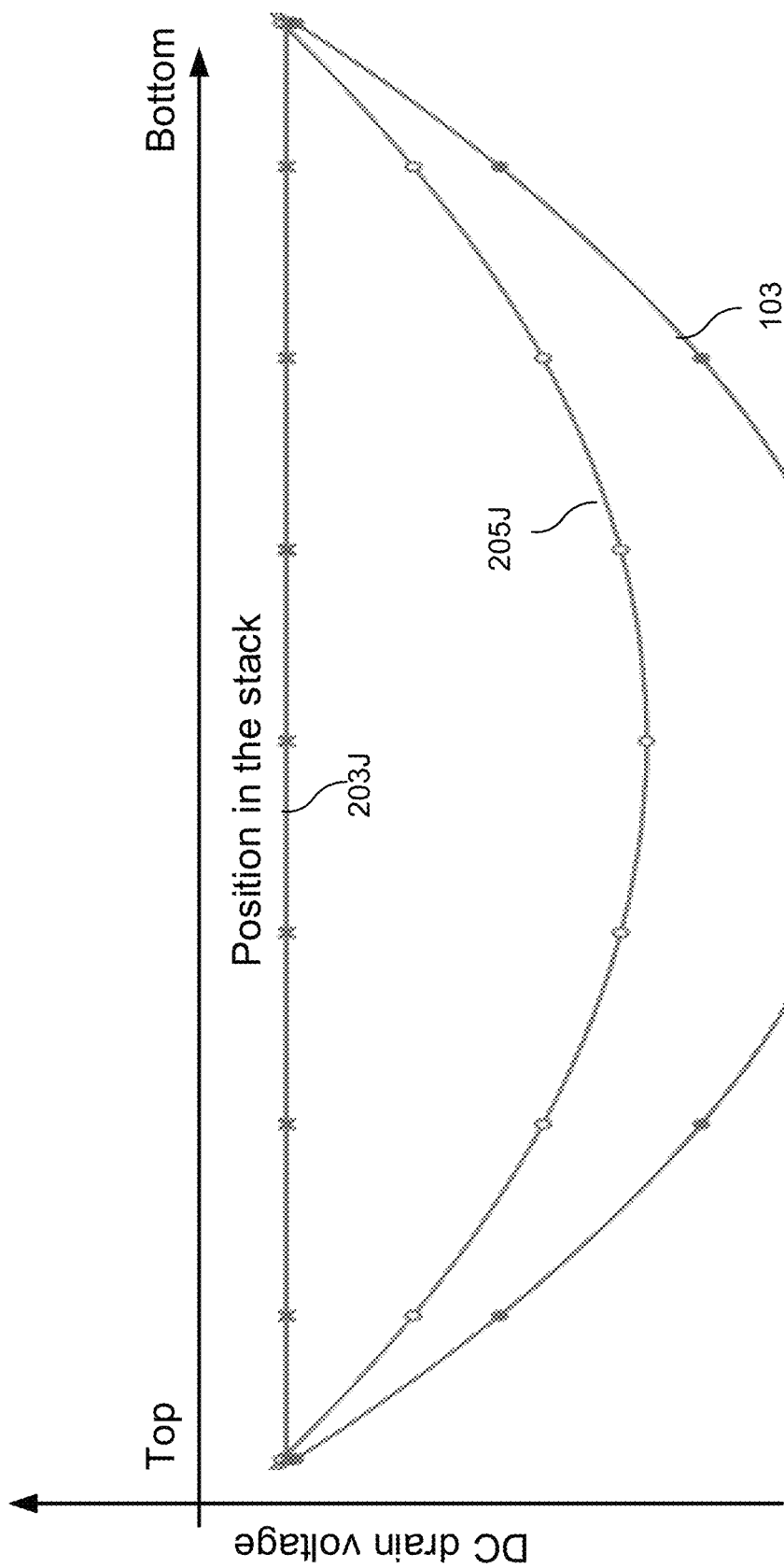

With combined reference to FIG. 2A and, for example, FIG. 2G, as mentioned previously, the hybrid approach of using a combination of inductors and resistors in the structure of body and/or drain bias ladders, is a matter of tradeoff among i) reducing the occupied space on the chip, ii) reducing the de-biasing effect and iii) meeting the switch stack Roff requirement. In order to demonstrate such tradeoff, reference is made to FIG. 2J wherein:

curve (103) is a reproduction of curve (103) of FIG. 2B shown here for comparison purpose and shows the drain DC voltage profile vs. the transistor position within the stack for the exemplary prior art switch stack of FIG. 1A, curve (203J) represents the same profile as above for the embodiment of FIG. 2A, curve (205J) represents the same profile as above for the embodiment of FIG. 2G.

As can be noticed, the application of the disclosed teachings reduces substantially the drain de-biasing. Moreover, the larger the number of inductors used as part of the drain bias ladder, the larger the compensation effect on the de-biasing negative impact.

Figure 2K:
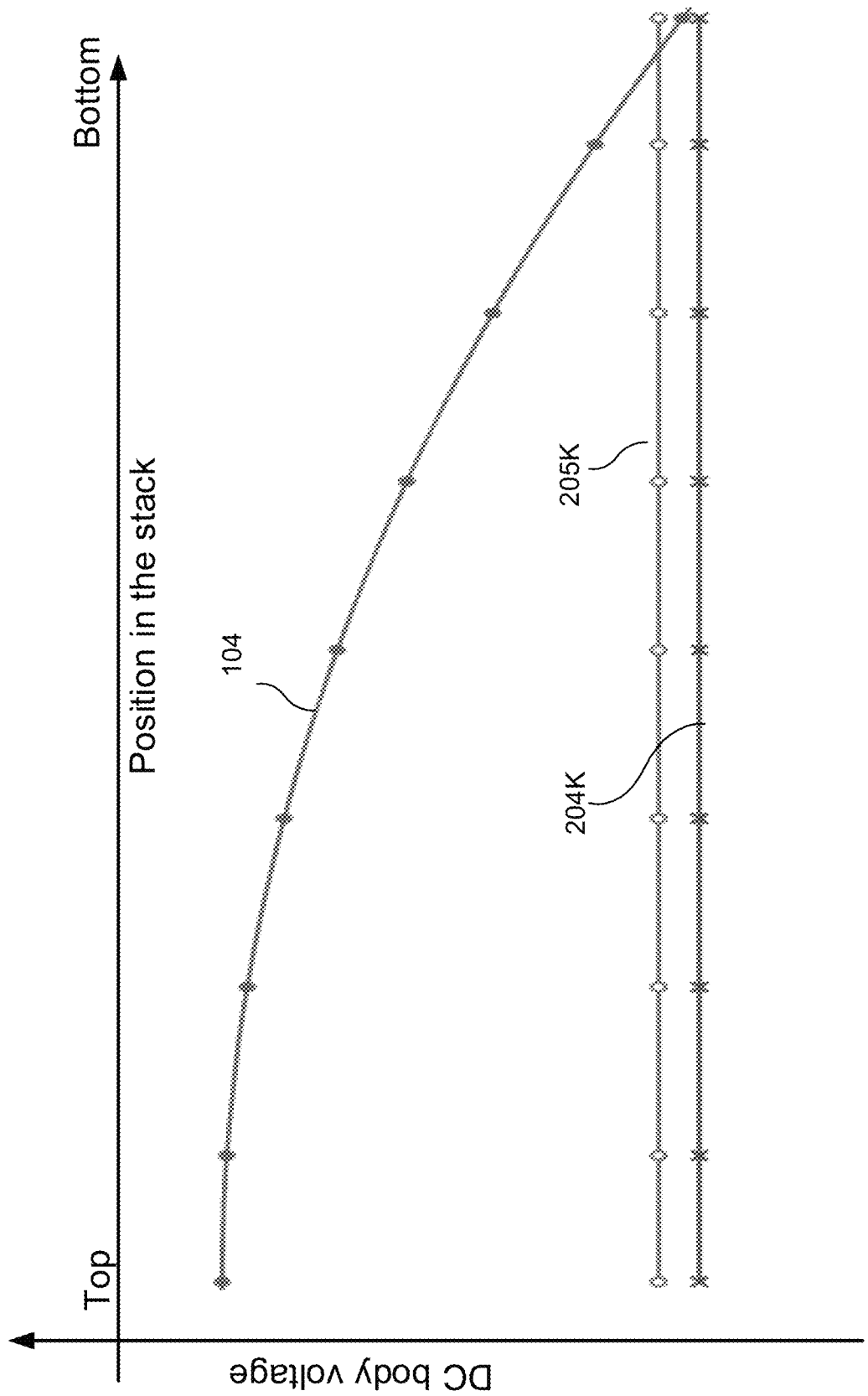

With reference now to FIG. 2K:

curve (104) is a reproduction of curve (104) of FIG. 2C shown here for comparison purpose and shows the body DC voltage profile vs. the transistor position within the stack for the exemplary prior art switch stack of FIG. 1A, curve (204K) represents the same profile as above for the embodiment of FIG. 2A, curve (205K) represents the same profile as above for the embodiment of FIG. 2G.

As can be noticed, the application of the disclosed teachings reduces substantially the body de-biasing. Additionally, the larger the number of inductors used as part of the body bias ladder, the larger the compensation of the de-biasing negative impact.

The disclosed teachings can be applied to RF switches operating across a wide range of frequencies. As frequency increases the physical space needed create the same inductive impedance reduces. Implementations in the millimeter wave region 30-300 GHz can more readily employ a FIG. 2A architecture while lower frequencies will likely benefit from a hybrid implementation. With further reference to FIGS. 2A, and 2D-2I, the disclosed FET switch stacks may be implemented in a shunt configuration where node (N2) is ground or a reference voltage. Such FET switches may also be implemented in a series configuration where the FET switch stack is connected at node (N2) to the rest of an RF circuit including other RF nodes.

Figure 3A:
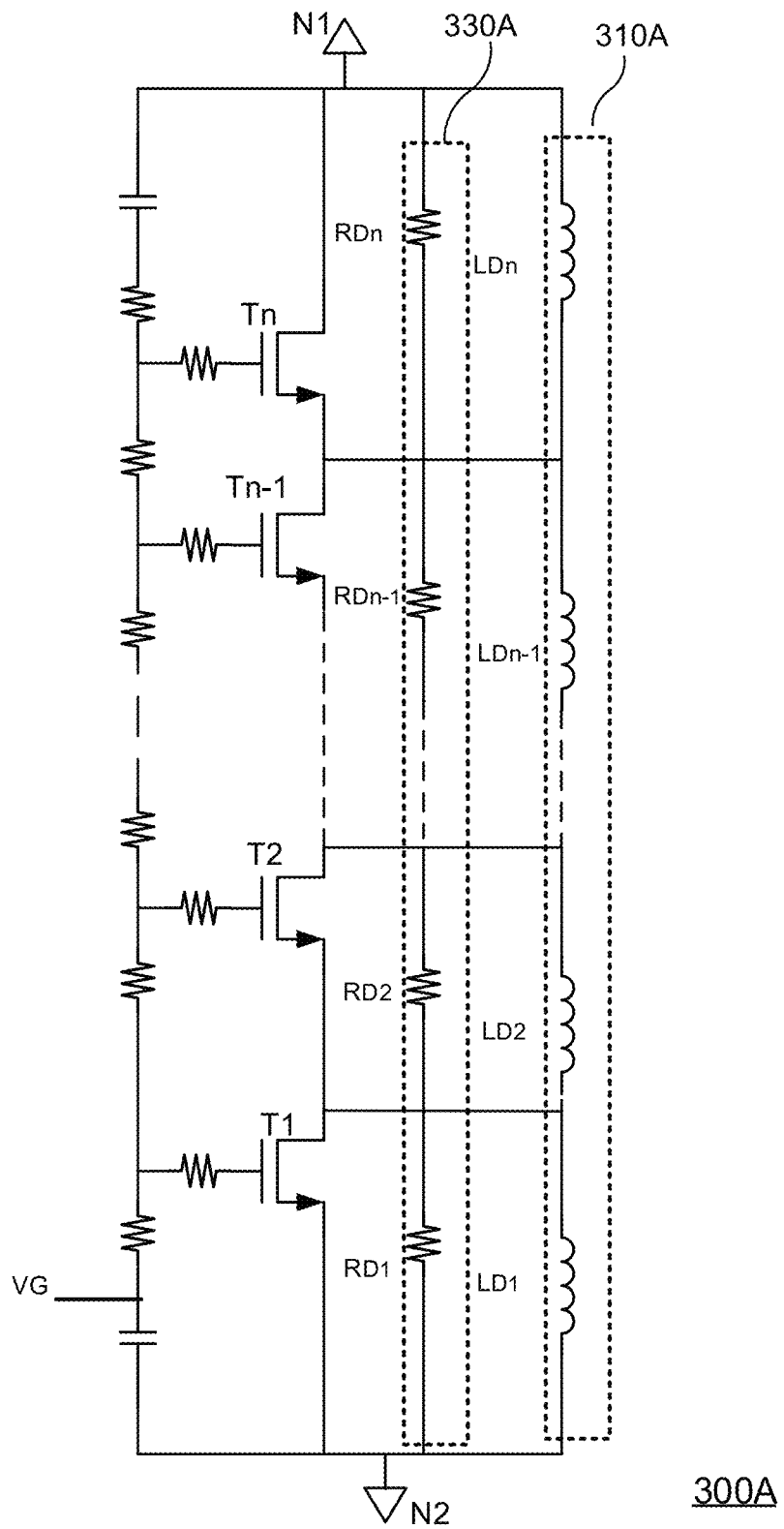
FIGS. 3A-3C show exemplary FET switch stacks according to an embodiment of the present disclosure.

The person skilled in the art will understand that the above-described embodiments represent some exemplary implementations of the disclosed teachings, and other different implementations may also be envisaged. FIG. 3A shows an exemplary FET switch stack (300A) according to an embodiment of the present disclosure. Similar to, for example, the embodiment of FIG. 2A, FET switch stack (300A) comprises a series arrangement of transistors (T1, . . . , Tn) and implements a bias network including a drain-source bias ladder (310A) including drain-source inductors (LD1, . . . , LDn) and a gate resistor structure on the gate side of the transistors as shown. In addition, differently from the embodiment of FIG. 2A, FET switch stack (300A) further comprises a drain-source resistive ladder (330A) including drain-source resistors (RD1, ..., RDn). The configuration shown in FIG. 3A, provides a means to present a uniform impedance across drain-source terminals of transistors (T1, ..., Tn) that is not frequency dependent. In other words, such configuration effectively separates the low frequency behavior from the high frequency RF behavior by dedicating the inductors for low frequency and resistors for high frequency. In another embodiment, a body bias ladder such as, for example, body ladder bias (220A) of FIG. 2A may also be implemented as an addition to the embodiment of FIG. 3A.

Figure 3B:
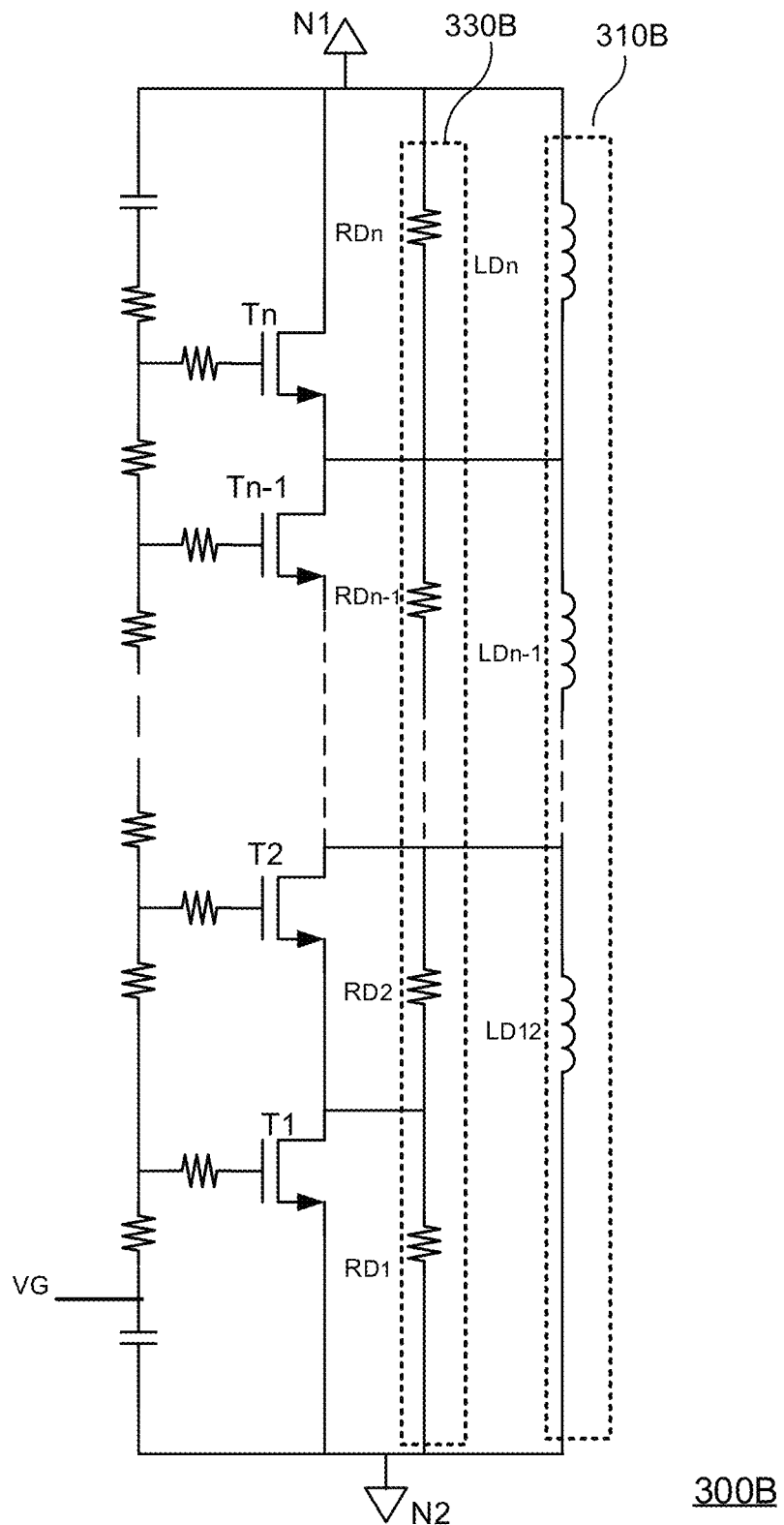

FIG. 3B shows another exemplary FET switch stack (300B) according to an embodiment of the present disclosure. The principle of operation of FET switch stack (300B) is similar to what was described with regards to FET switch stack (300A) of FIG. 3A, except that inductor (LDS12) is implemented across the series arrangement of transistors (T1, T2) instead of having individual inductors connected across each individual transistor (T1, T2). This will save space on the chip while benefiting from the presence of inductor (LDS12).

Figure 3C:
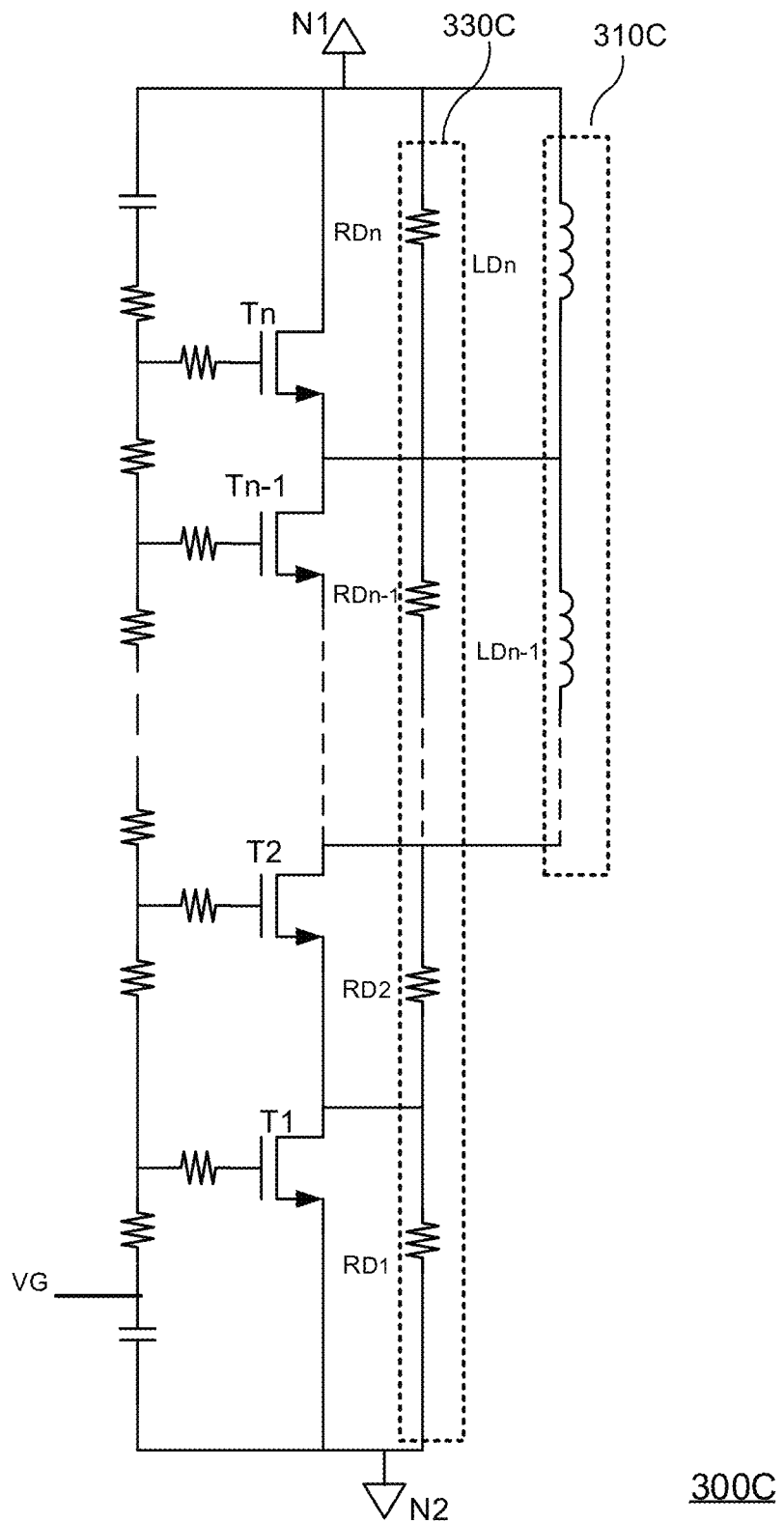

FIG. 3C shows yet another exemplary FET switch stack (300C) according to an embodiment of the present disclosure. In this embodiment, no inductor across, for example, transistors (T1, T2) is implemented to save further space while still benefiting from the presence of drain-source bias ladder (310C) as shown.

Figure 4A:
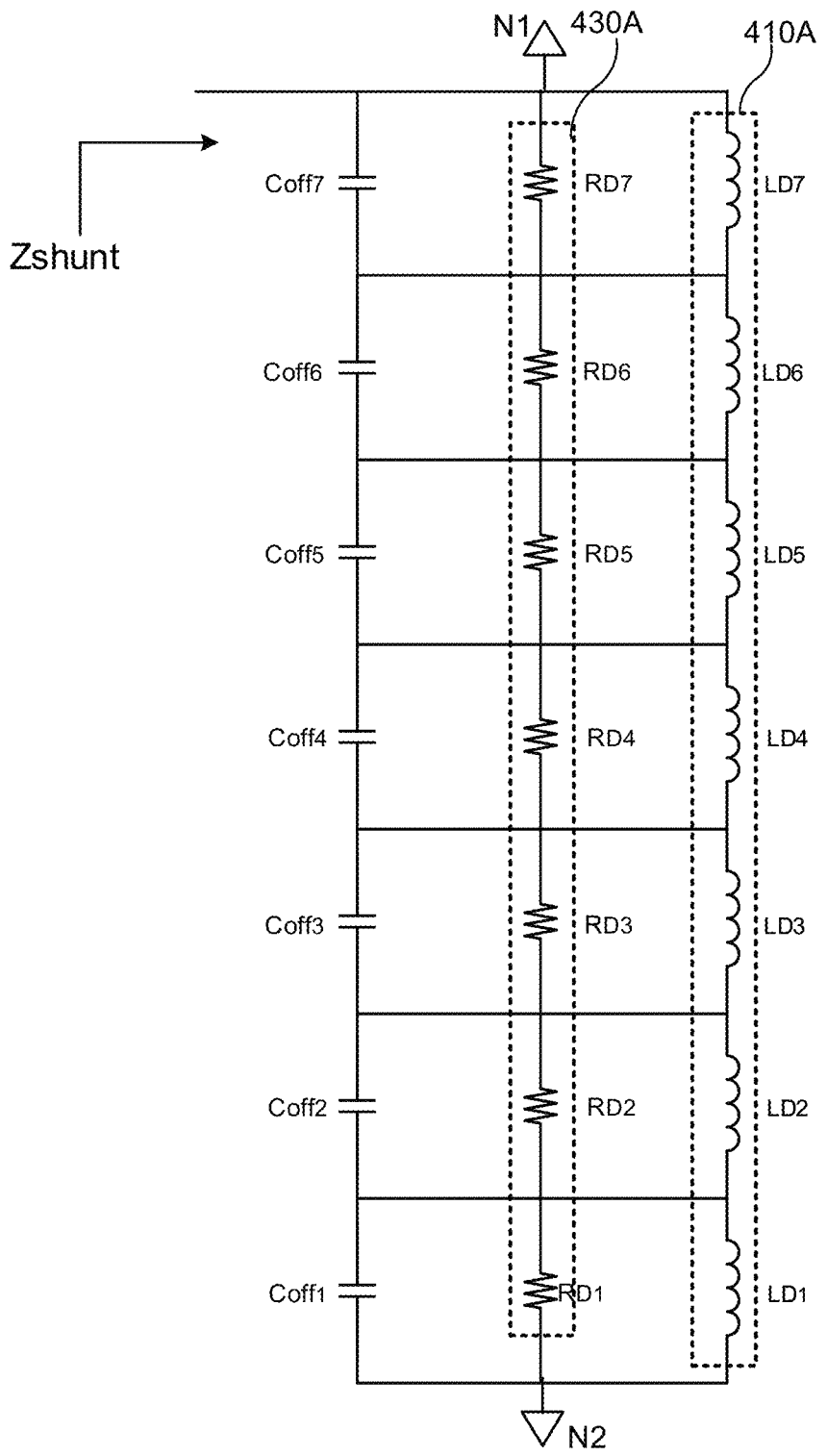
FIG. 4A shows an exemplary schematic diagram of a switch stack in the OFF state according to an embodiment of the present disclosure.
Figure 4B:
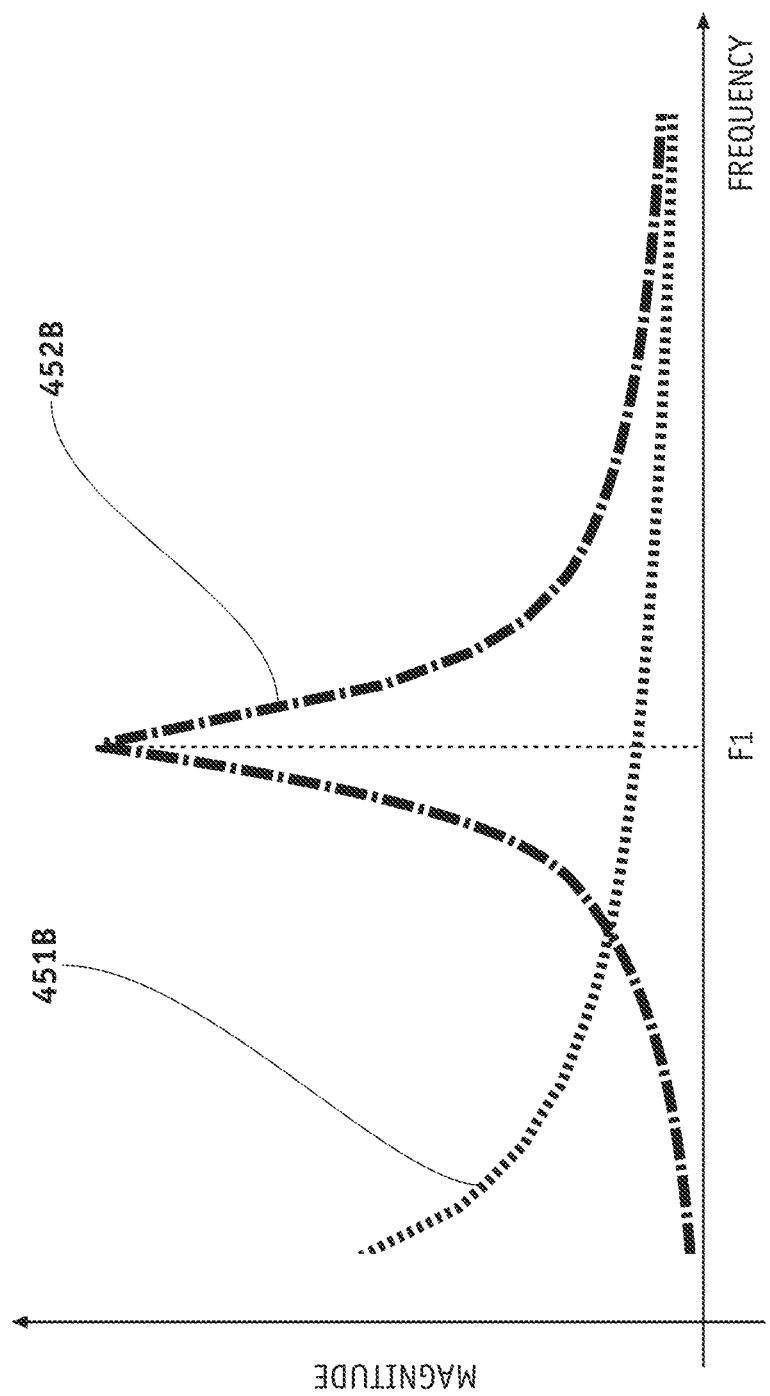
FIG. 4B shows an exemplary graph illustrating the compensation of the off-capacitance of the transistors of the switch stack according to an embodiment of the present disclosure.

According to the teachings of the present disclosure, the addition of an inductive drain-source bias ladder as described above can also provide the benefit of tuning-out and compensating for the off-capacitance (Coff) of transistors of the switch stack in the OFF state. To further clarify this, reference is made to FIG. 4A showing an exemplary schematic diagram (400A) of a switch stack in the OFF state, wherein the transistors are each represented by their respective off-capacitances (Coff1, ..., Coff7). Also shown in FIG. 4A, are inductive and resistive bias ladders (410A, 430A) respectively. FIG. 4B shows graph (400B) illustrating the tuning-out (compensation) of the off-capacitance (Coff) of the transistors of the switch stack. With reference to FIGS. 4A-4B, curve (451B) of FIG. 4B shows the variation of the magnitude of the impedance (Zshunt) as seen between nodes (N1, N2) vs. frequency, when the inductive bias ladder (410A) of FIG. 4A is not present. On the other hand, curve (452B) shows the variation of the magnitude of the impedance (Zshunt) vs. frequency for a certain inductance value of the inductors within the inductive bias ladder (410A), e.g., 2 nH. As can be noticed, the off-capacitance behavior of the switch stack is tuned-out at frequency (F1).

Figure 4C:
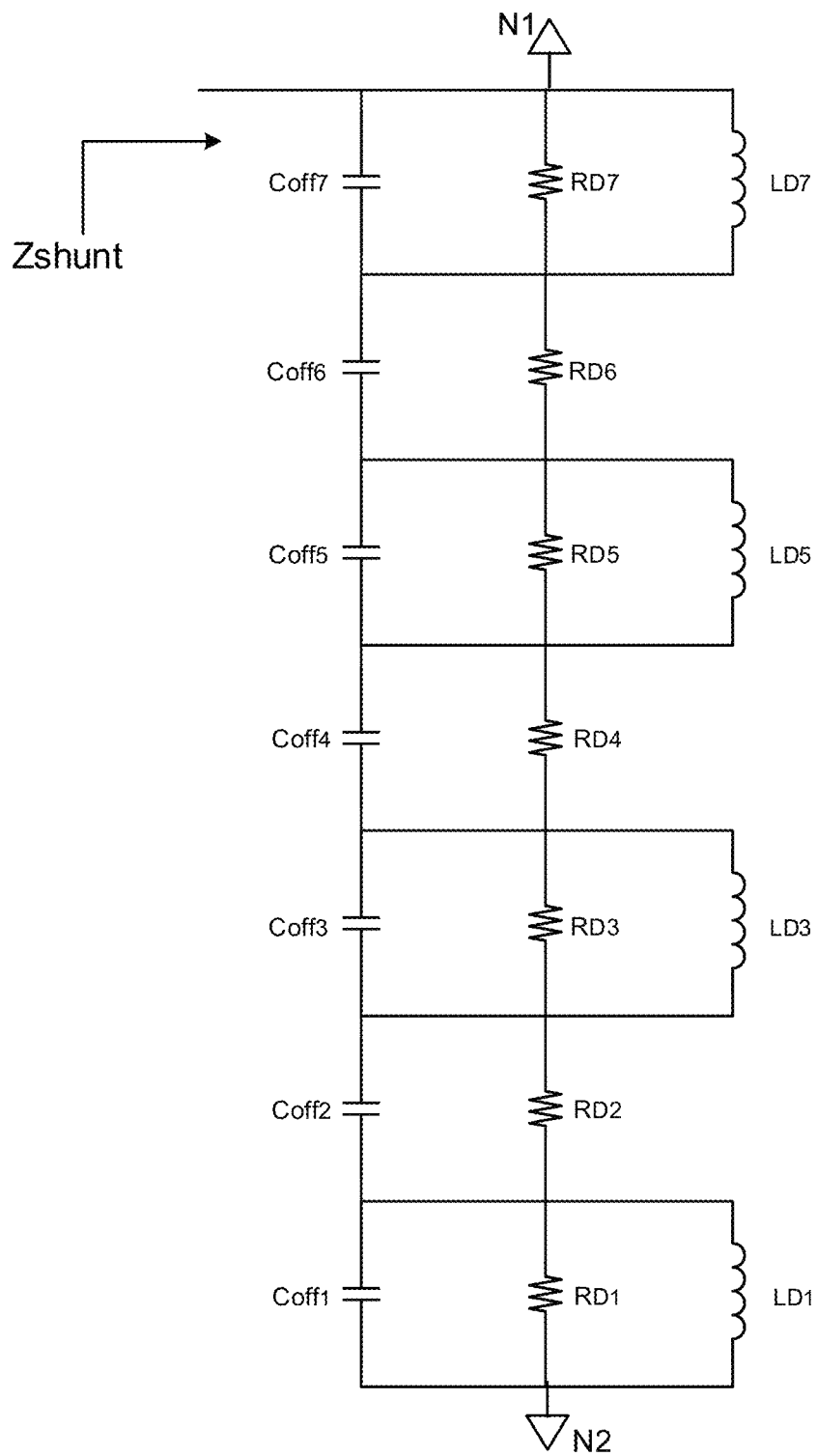
FIG. 4C shows an exemplary schematic diagram of a switch stack in the OFF state according to an embodiment of the present disclosure.
Figure 4D:
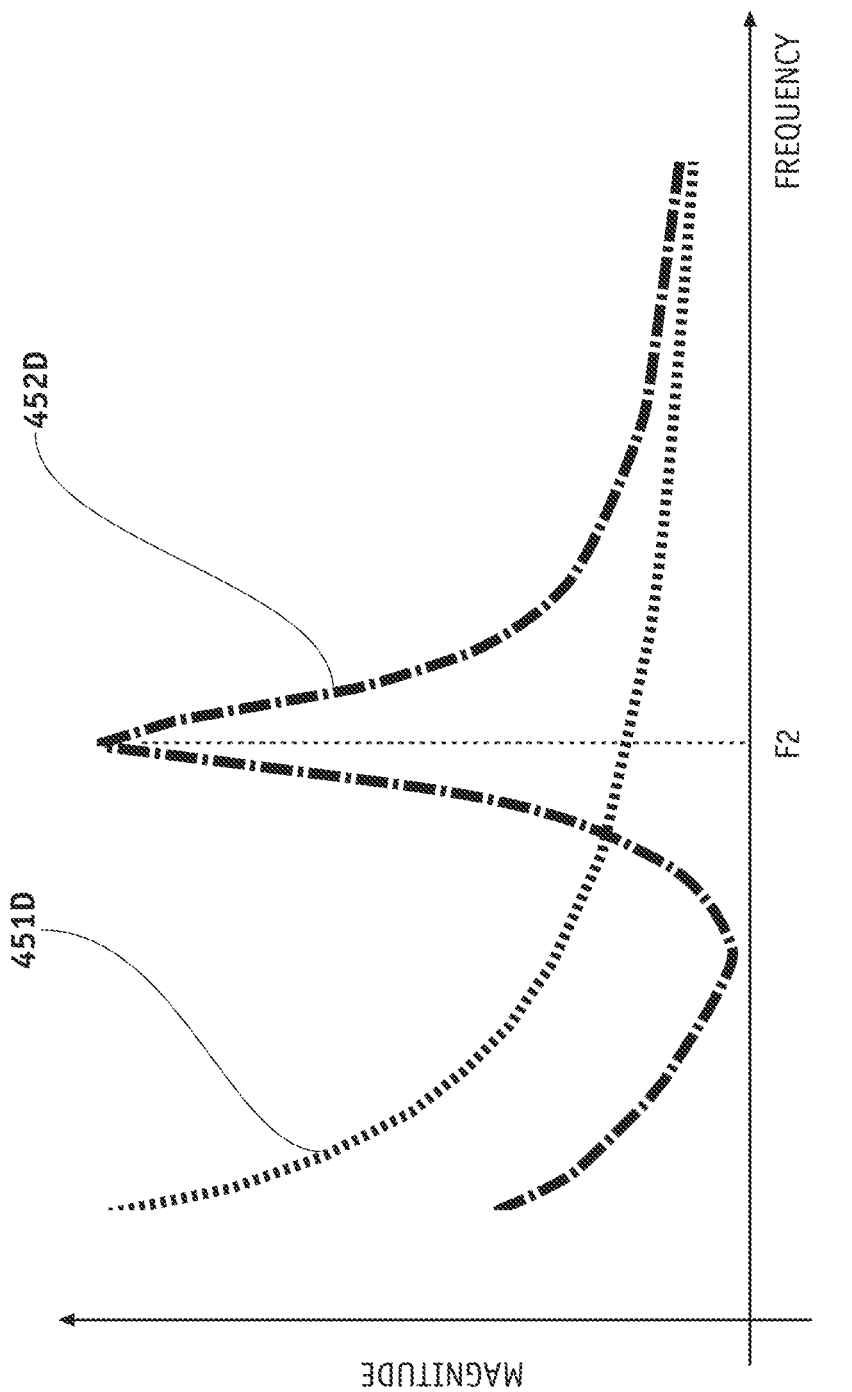
FIG. 4D shows an exemplary graph illustrating the compensation of the off-capacitance of the transistors of the switch stack according to an embodiment of the present disclosure.

FIG. 4C shows an exemplary schematic diagram (400C) which is similar to the schematic diagram (400A) of FIG. 4A, except that inductors (L2, L4, L6) have been removed to save on-chip space. Similar to FIG. 4B, FIG. 4D shows graph (400D) illustrating the tuning-out (compensation) of the off-capacitors of the transistors within the stack of FIG. 4C, and by virtue of implementing inductors (L1, L3, L5, L7). Curves (451D, 452D) are counter parts of curves (451B, 452B) of FIG. 4B, respectively. As can be noticed, the off-capacitance behavior of the switch stack is tuned-out at frequency (F2).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A switch stack comprising:
a plurality of field-effect transistors (FETs) arranged in series and connected at one end to a first node and at another end to a second node;
a drain bias ladder comprising one or more drain inductors coupled across drain and source terminals of corresponding one or more first FETs of the plurality of FETs, and
one or more drain resistors in series with the one or more drain inductors, the one or more drain resistors coupled across drain and source terminals of corresponding one or more second FETs of the plurality of FETs, the one or more second FETs being different from the one or more first FETs.

2. The switch stack of claim 1, wherein the one or more first FETs comprise a first FET disposed in a middle of the switch stack.

3. The switch stack of claim 1, wherein the one or more first FETs comprise a FET other than a top FET being the closest to the first node or a bottom FET being the closest to the second node.

4. The switch stack of claim 1, wherein the one or more first FETs or the one or more second FETs comprise FETs other than a top FET being the closest to the first node or a bottom FET being the closest to the second node.

5. A switch stack comprising:
a plurality of field-effect transistors (FETs) arranged in series and connected at one end to a first node and at another end to a second node;
a drain bias ladder comprising one or more drain inductors coupled across drain and source terminals of corresponding one or more first FETs of the plurality of FETs, and a body bias ladder comprising one or more body inductors, wherein each of the one or more body inductors is coupled across body terminals of a corresponding pair of first adjacent FETs.

6. The switch stack of claim 1 implemented in a shunt or a series configuration.

7. The switch stack of claim 1 configured to operate within a frequency range of 30 GHz to 300 GHz.

8. The switch stack of claim 1, wherein the one or more drain inductors are coupled across drain and source terminals of corresponding one or more first FETs of the plurality of FETs via respective resistors.

9. A switch stack comprising:
a plurality of field-effect transistors (FETs) arranged in series and connected at one end to a first node and at another end to a second node; and
a drain bias ladder comprising one or more drain inductors coupled across drain and source terminals of corresponding one or more first FETs of the plurality of FETs, wherein one or more of drain inductor values are selected to resonate with the corresponding one or more first FETs off capacitance within a band of operation.

10. The switch stack of claim 5, wherein a first end of each of the one or more body inductors is coupled to a body terminal of a first corresponding FET via a first resistor, and a second end of each of the one or more body inductors is connected to a body terminal of a second corresponding FET via a second resistor, and wherein the first and the second corresponding FETs are adjacent FETs.

11. The switch stack of claim 5, wherein a series combination of a first body inductor of the one or more body inductors with a first series capacitor is coupled across the first node and a body terminal of a top FET, the top FET being closest to the first node, or a series combination of a second body inductor of the one or more body inductors with a second series capacitor is coupled across the second node and a body terminal of a bottom FET, the bottom FET being the closest to the second node.

12. The switch stack of claim 5, further comprising one or more drain resistors in series with the one or more drain inductors, the one or more drain resistors coupled across drain and source terminals of corresponding one or more second FETs of the plurality of FETs, the one or more second FETs being different from the one or more first FETs.

13. The switch stack of claim 5, wherein the one or more first FETs comprise a first FET disposed in a middle of the switch stack.

14. The switch stack of claim 5, wherein the one or more first FETs comprise a FET other than a top FET being the closest to the first node or a bottom FET being the closest to the second node.

15. The switch stack of claim 12, wherein the one or more first FETs or the one or more second FETs comprise FETs other than a top FET being the closest to the first node or a bottom FET being the closest to the second node.

16. The switch stack of claim 5 implemented in a shunt or a series configuration.

17. The switch stack of claim 5 configured to operate within a frequency range of 30 GHz to 300 GHz.

18. The switch stack of claim 5, wherein:
the body bias ladder further comprises one or more body resistors in series with the one or more body inductors;
each of the one or more body resistors is coupled across body terminals of a corresponding pair of second adjacent FETs, and any two pairs of adjacent FETs including one pair from the first adjacent FETs and one pair from the second adjacent FETs have at most one FET in common.

19. The switch stack of claim 5, wherein:

body terminals of one or more pairs of second adjacent FETs are tied together, and any two pairs of adjacent FETs including one pair from the first adjacent FETs and one pair from the second adjacent FETs have at most one FET in common.

20. The switch stack of claim 9, wherein the one or more first FETs comprise a first FET disposed in a middle of the switch stack.

21. The switch stack of claim 9, wherein the one or more first FETs comprise a FET other than a top FET being the closest to the first node or a bottom FET being the closest to the second node.

* * * * *